United States Patent
Na et al.

(10) Patent No.: US 8,542,045 B2
(45) Date of Patent: Sep. 24, 2013

(54) DUTY CORRECTING CIRCUIT, DELAY-LOCKED LOOP CIRCUIT AND METHOD OF CORRECTING DUTY

(75) Inventors: Tae-Sik Na, Seoul (KR); Jun-Bae Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 84 days.

(21) Appl. No.: 13/078,151

(22) Filed: Apr. 1, 2011

(65) Prior Publication Data

US 2011/0298513 A1 Dec. 8, 2011

(30) Foreign Application Priority Data

Jun. 7, 2010 (KR) .................. 10-2010-0053377
Sep. 13, 2010 (KR) .................. 10-2010-0089654

(51) Int. Cl.
*H03K 3/017* (2006.01)
*H03K 5/04* (2006.01)
*H03K 7/08* (2006.01)

(52) U.S. Cl.
USPC ..................... 327/175; 327/176; 327/177

(58) Field of Classification Search
USPC ......................... 327/175, 176, 177
See application file for complete search history.

(56) References Cited

U.S. PATENT DOCUMENTS

| | | | |
|---|---|---|---|
| 5,572,158 A | 11/1996 | Lee et al. | |
| 6,573,779 B2 | 6/2003 | Sidiropoulos et al. | |
| 7,135,906 B2 | 11/2006 | Takai et al. | |
| 7,535,270 B2 | 5/2009 | Lee et al. | |
| 7,710,173 B2 * | 5/2010 | Shim | 327/158 |
| 7,847,609 B2 * | 12/2010 | Shin | 327/175 |
| 8,274,318 B2 * | 9/2012 | Lee | 327/175 |

FOREIGN PATENT DOCUMENTS

| | | |
|---|---|---|
| JP | 06-061809 A | 3/1994 |
| JP | 2005-051673 A | 2/2005 |
| JP | 2008-059741 A | 3/2008 |
| KR | 2000-0043233 A | 7/2000 |
| KR | 2005-0006885 A | 1/2005 |
| KR | 2007-0111786 A | 11/2007 |
| KR | 10-0853462 B1 | 3/2008 |
| KR | 10-0843002 B1 | 4/2008 |

* cited by examiner

*Primary Examiner* — John Poos
(74) *Attorney, Agent, or Firm* — Harness, Dickey & Pierce, P.L.C.

(57) ABSTRACT

The duty correcting circuit includes a duty cycle corrector, a duty detector and a duty correction code generator. The duty cycle corrector corrects a duty cycle of an input clock signal to generate an output clock signal. The duty detector adjusts a delay time of the output clock signal to generate a sampling clock signal, samples the output clock signal in response to the sampling clock signal to generate sample data, and detects a duty of the output clock signal based on logic states of the sample data. Therefore, the duty correcting circuit precisely detects and corrects a duty of the output clock signal.

18 Claims, 24 Drawing Sheets

| SD | SDB | CONTROL |
|----|-----|---------|
| 1  | 1   | delay up |
| 0  | 0   | delay down |
| 0  | 1   | duty up |
| 1  | 0   | duty down |

DELAY UP

DUTY DOWN

DELAY UP

DELAY DOWN

DELAY UP/DOWN REPEAT, DCC END

FIG. 20
| SA | CONTROL |
|----|---------|
| 0  | DUTY UP |
| 1  | DUTY DOWN |
| SB | CONTROL |
|----|---------|
| 0  | DELAY UP |
| 1  | DELAY DOWN |
FIG. 21
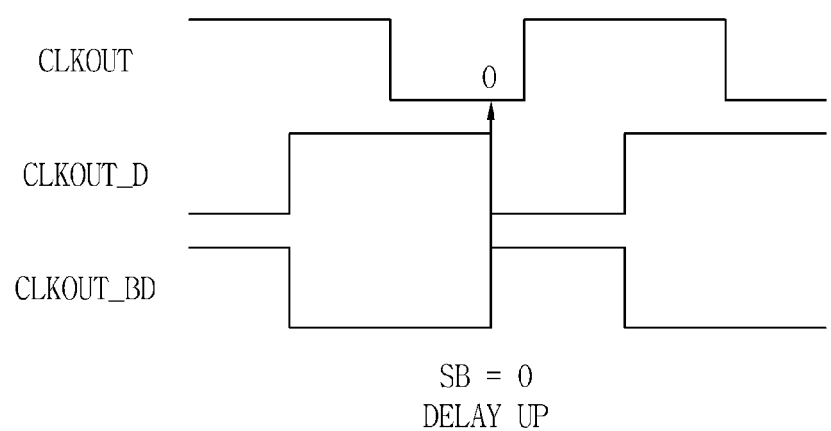
SB = 0
DELAY UP
FIG. 22
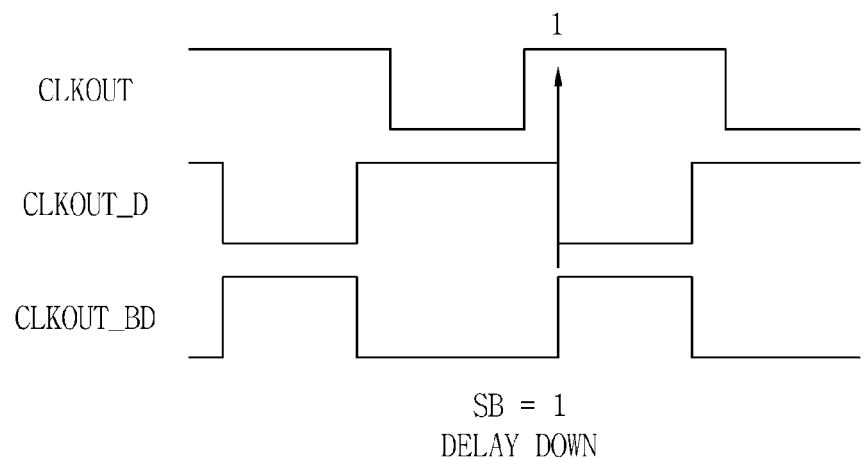
SB = 1
DELAY DOWN

DUTY CORRECTING CIRCUIT, DELAY-LOCKED LOOP CIRCUIT AND METHOD OF CORRECTING DUTY

CROSS-REFERENCE TO RELATED APPLICATION

This application claims priority under 35 U.S.C. §119 to Korean Patent Application No. 10-2010-0053377 filed on Jun. 7, 2010 and Korean Patent Application No. 10-2010-0089654 filed on Sep. 13, 2010, in the Korean Intellectual Property Office (KIPO), the entire contents of which are hereby incorporated by reference.

BACKGROUND

1. Field

Example embodiments of inventive concepts relate to a duty correcting circuit, and more particularly to a duty correcting circuit including a charge pump circuit and a method of correcting a duty.

2. Description of Related Art

Logic circuits of a semiconductor device, particularly, a semiconductor memory device, may operate in response to clock signals. An internal clock signal having a corrected duty and synchronized with an external input clock signal in consideration of a clock transmission path is needed so that an internal circuit having various functions can operate in response to the internal clock signal.

SUMMARY

Example embodiments of inventive concepts provide a duty correcting circuit including a duty detector operating in a digital mode with high precision.

Example embodiments of inventive concepts also provide a delay-locked loop (DLL) circuit including the duty correcting circuit.

Example embodiments of inventive concepts also provide a method of detecting and correcting a duty in a digital mode with high precision.

In accordance with an example embodiment of the inventive concept, a duty correcting circuit includes a duty cycle corrector, a duty detector and a duty correction code generator. The duty cycle corrector corrects a duty cycle of an input clock signal in response to a duty correction code to generate an output clock signal. The duty detector adjusts a delay time of the output clock signal to generate a sampling clock signal, samples the output clock signal in response to the sampling clock signal to generate first sample data and second sample data, and detects a duty of the output clock signal based on logic states of the first sample data and the second sample data to generate a duty-up signal and a duty-down signal. The duty correction code generator generates the duty correction code in response to the duty-up signal and the duty-down signal.

In at least one example embodiment, the duty detector may adjust the delay time of the output clock signal based on the logic states of the first and second sample data.

In at least one example embodiment, the duty detector may include a phase splitter, a first delay circuit, a second delay circuit, a first flip-flop, a second flip-flop and a control circuit. The phase splitter splits a phase of the output clock signal to generate a first clock signal and a second clock signal having a phase difference of 180° from the first clock signal. The first delay circuit adjusts a delay amount in response to a delay-up signal and a delay-down signal, and delays the first clock signal to generate a third clock signal. The second delay circuit adjusts a delay amount in response to the delay-up signal and the delay-down signal, and delays the second clock signal to generate a fourth clock signal. The first flip-flop samples the first clock signal in response to the third clock signal to generate the first sample data. The second flip-flop samples the second clock signal in response to the fourth clock signal to generate the second sample data. The control circuit detects the duty of the output clock signal based on logic states of the first sample data and the second sample data to generate the delay-up signal, the delay-down signal, the duty-up signal and the duty-down signal.

In at least one example embodiment, the duty detector may generate the delay-up signal to increase the delay time of the output clock signal when the first sample data and the second sample data are enabled, and may generate the delay-down signal to decrease the delay time of the output clock signal when the first sample data and the second sample data are disabled.

In at least one example embodiment, the duty detector may generate the duty-up signal to increase the duty of the output clock signal when the first sample data is disabled and the second sample data is enabled.

In at least one example embodiment, the duty detector may generate the duty-down signal to decrease the duty of the output clock signal when the first sample data is enabled and the second sample data is disabled.

In at least one example embodiment, the duty detector may include a phase splitter, a delay circuit, a first flip-flop, a second flip-flop, and a control circuit. The phase splitter splits a phase of the output clock signal to generate a first clock signal and a second clock signal having a phase opposite to the first clock signal. The delay circuit adjusts a delay amount in response to a delay-up signal and a delay-down signal, and delays the first clock signal to generate a third clock signal. The first flip-flop samples the first clock signal in response to a rising edge of the third clock signal to generate the first sample data. The second flip-flop samples the second clock signal in response to a falling edge of the third clock signal to generate the second sample data. The control circuit detects the duty of the output clock signal based on logic states of the first sample data and the second sample data to generate the delay-up signal, the delay-down signal, the duty-up signal and the duty-down signal.

In at least one example embodiment, the duty detector may include a first phase splitter, a delay circuit, a second phase splitter, a first flip-flop, a second flip-flop and a control circuit. The first phase splitter splits a phase of the output clock signal to generate a first clock signal and a second clock signal having a phase opposite to the first clock signal. The delay circuit adjusts a delay amount in response to a delay-up signal and a delay-down signal, and delays the first clock signal. The second phase splitter splits a phase of an output signal of the delay circuit to generate a third clock signal and a fourth clock signal having a phase difference of 180° from the third clock signal. The first flip-flop samples the first clock signal in response to the third clock signal to generate the first sample data. The second flip-flop samples the second clock signal in response to the fourth clock signal to generate the second sample data. The control circuit detects the duty of the output clock signal based on logic states of the first sample data and the second sample data to generate the delay-up signal, the delay-down signal, the duty-up signal and the duty-down signal.

In accordance with another example embodiment of the inventive concept, the duty correcting circuit includes a duty cycle corrector and a duty detector. The duty cycle corrector corrects a duty cycle of an input clock signal in response to a duty-up signal and a duty-down signal to generate an output clock signal. The duty detector delays the output clock signal to generate a delayed output clock signal, inverts a phase of the delayed output clock signal to generate an inverted and delayed output clock signal, synchronizes the output clock signal to the inverted and delayed output clock signal, samples the output clock signal in response to the inverted and delayed output clock signal to generate first sample data and second sample data, and detects a duty of the output clock signal based on logic states of the first sample data and the second sample data to generate the duty-up signal and the duty-down signal.

In at least one example embodiment, the duty detector may adjust a delay time of the output clock signal based on a logic state of the first sample data which is the output clock signal sampled at a rising edge of the inverted and delayed output clock signal, and may detect a duty of the output clock signal based on a logic state of the second sample data which is the output clock signal sampled at a falling edge of the inverted and delayed output clock signal.

In at least one example embodiment, the duty detector may adjust the delay time of the output clock signal using a delay line of a DLL circuit.

In at least one example embodiment, the duty detector may include a delay circuit, an inverter, a first flip-flop, a second flip-flop and a control circuit. The delay circuit delays the output clock signal in response to a delay-up signal and a delay-down signal to generate the delayed output clock signal. The inverter inverts the delayed output clock signal to generate the inverted and delayed output clock signal. The first flip-flop samples the output clock signal in response to a falling edge of the inverted and delayed output clock signal to generate the first sample data. The second flip-flop samples the output clock signal in response to a rising edge of the inverted and delayed output clock signal to generate the second sample data. The control circuit generates the delay-up signal, the delay-down signal, the duty-up signal and the duty-down signal based on logic states of the first sample data and the second sample data.

In at least one example embodiment, the duty detector may generate the delay-up signal to increase the delay time of the output clock signal when the second sample data has a first logic state, and may generate the delay-down signal to decrease the delay time of the output clock signal when the second sample data has a second logic state.

In at least one example embodiment, the duty detector may generate the duty-up signal to increase the duty of the output clock signal when an output enable signal is enabled and the first sample data has a first logic state, and may generate the duty-down signal to decrease the duty of the output clock signal when the output enable signal is enabled and the first sample data has a second logic state.

In at least one example embodiment, the delay circuit may include a delay line of a DLL circuit.

In at least one example embodiment, the duty correcting circuit may further include a duty correction code generator that generates a duty correction code in response to the duty-up signal and the duty-down signal and provides the duty correction code to the duty cycle corrector.

In accordance with still another example embodiment of the inventive concept, the DLL circuit includes a duty cycle corrector, a delay circuit, a duty detector, a replica path and a phase detector. The duty cycle corrector corrects a duty cycle of an input clock signal in response to a duty-up signal and a duty-down signal to generate an output clock signal. The delay circuit delays the output clock signal to generate a delayed output clock signal. The duty detector inverts a phase of the delayed output clock signal to generate an inverted and delayed output clock signal, synchronizes the output clock signal to the inverted and delayed output clock signal, samples the output clock signal in response to the inverted and delayed output clock signal to generate sample data, and detects a duty of the output clock signal based on logic states of the sample data to generate the duty-up signal and the duty-down signal. The replica path delays the delayed output clock signal to generate a feedback signal when a duty correction is completed. The phase detector detects a phase difference between the input clock signal and the feedback signal to generate the up signal and the down signal, and provides the up signal and the down signal to the delay circuit.

In at least one embodiments, the duty correcting circuit may further include a duty correction code generator that generates a duty correction code in response to the duty-up signal and the duty-down signal and provides the duty correction code to the duty cycle corrector.

In accordance with yet another example embodiment of the inventive concept, a method of correcting a duty includes: adjusting a delay time of an output clock signal to generate a sampling clock signal; sampling the output clock signal in response to the sampling clock signal to generate first sample data and second sample data; detecting a duty of the output clock signal based on logic states of the first sample data and the second sample data to generate a duty-up signal and a duty-down signal; generating a duty correction code in response to the duty-up signal and the duty-down signal; and correcting a duty cycle of an input clock signal in response to the duty correction code to generate the output clock signal.

In at least one example embodiment, the method may adjust the delay time of the output clock signal based on logic states of the first sample data and the second sample data.

A duty correcting circuit including a duty detector according to example embodiments of inventive concepts may adjust a delay time of a sampling clock signal and detects a duty of an output clock signal in a digital mode based on logic states of sampled data. Therefore, the duty correcting circuit may detect and correct the duty of the output clock signal. The semiconductor device including the duty correcting circuit may have relatively small power consumption and a small chip size.

BRIEF DESCRIPTION OF THE DRAWINGS

FIG. 20 is a truth table illustrating operation of a control circuit included in the duty detector of FIG. 16.

FIGS. 21 to 26 are timing diagrams illustrating operation of a duty detector of FIG. 16.

Figure 1:
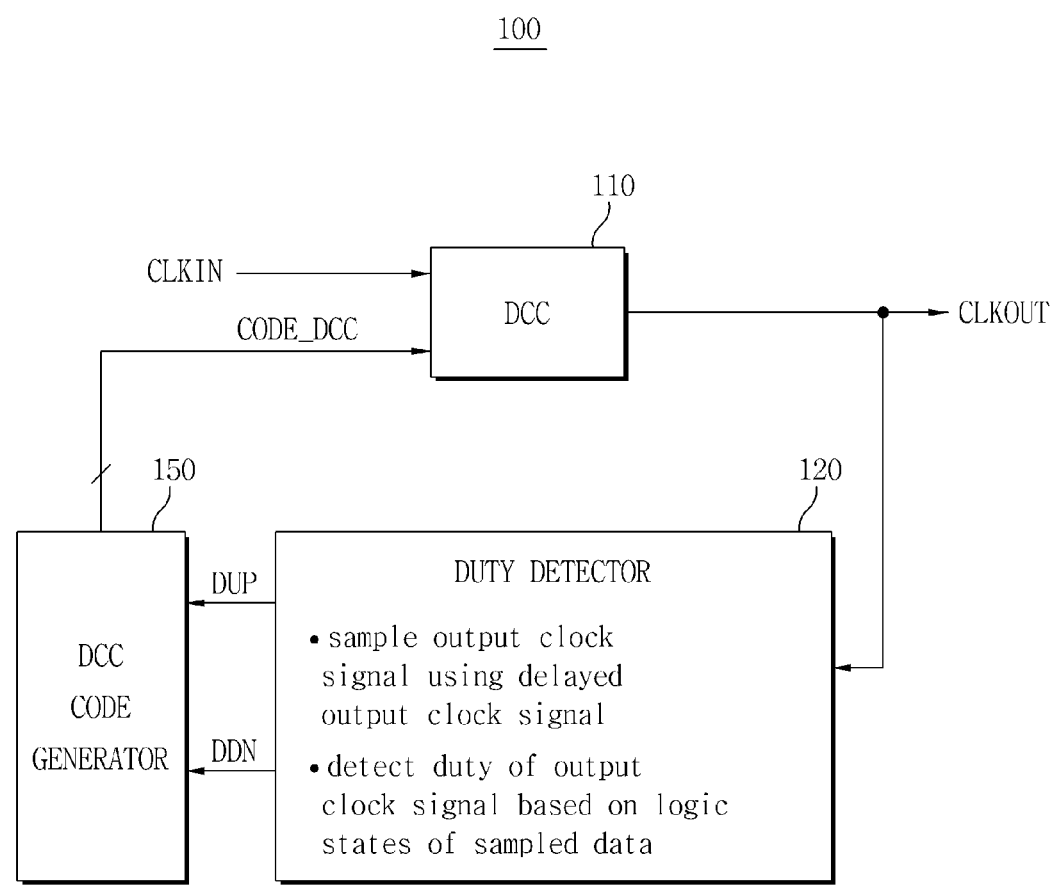
FIG. 1 is a block diagram of a duty correcting circuit according to example embodiments of inventive concepts.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective steps described in the example embodiments of the inventive concepts may be performed otherwise. That is, the respective steps may be performed in a specified order, substantially at the same time, or in reverse order.

Hereinafter, a duty correcting circuit, a delay-locked loop (DLL) circuit including the circuit, and a method of correcting a duty according to example embodiments of inventive concepts will be described with reference to the appended drawings. In the specification, terms such as "duty," "duty ratio" and "duty cycle" may be used interchangeably and may have similar meanings.

FIG. 1 is a block diagram of a duty correcting circuit according to example embodiments of inventive concepts.

Referring to FIG. 1, a duty correcting circuit 100 may include a duty cycle corrector 110, a duty detector 120, and a duty correction code generator 150.

The duty cycle corrector 110 may correct a duty cycle of an input clock signal CLKIN in response to a duty correction code CODE_DCC to generate an output clock signal CLKOUT. The duty detector 120 may adjust a delay time of the output clock signal CLKOUT to generate a sampling clock signal. The duty detector 120 may also sample the output clock signal CLKOUT in response to the sampling clock signal to generate first sample data and second sample data. The duty detector 120 may also detect a duty of the output clock signal CLKOUT based on logic states of the first sample data and the second sample data to generate a duty-up signal DUP and a duty-down signal DDN. The duty correction code generator 150 may generate the duty correction code CODE_DCC in response to the duty-up signal DUP and the duty-down signal DDN.

Figure 2:
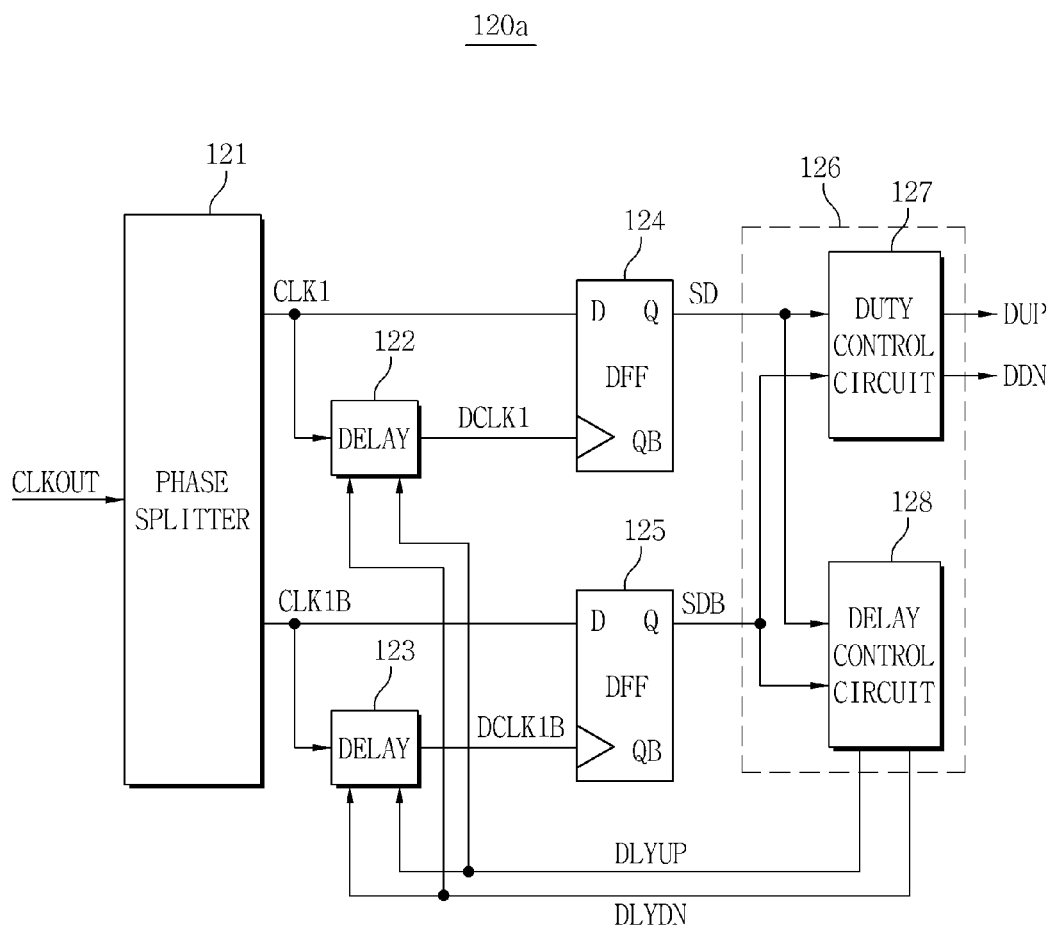
FIG. 2 is a circuit diagram of an example of a duty detector included in the duty correcting circuit of FIG. 1.

FIG. 2 is a circuit diagram of an example of the duty detector 120 included in the duty correcting circuit 100 of FIG. 1.

Referring to FIG. 2, a duty detector 120a may include a phase splitter 121, a first delay circuit 122, a second delay circuit 123, a first flip-flop 124, a second flip-flop 125 and a control circuit 126.

The phase splitter 121 may split a phase of the output clock signal CLKOUT to generate a first clock signal CLK1 and a second clock signal CLK1B having a phase difference of 180° from the first clock signal. The first delay circuit 122 may adjust a delay amount in response to a delay-up signal DLYUP and a delay-down signal DLYDN. The first delay circuit 122 may also delay the first clock signal CLK1 to generate a third clock signal DCLK1. The second delay circuit 123 may adjust a delay amount in response to the delay-up signal DLYUP and the delay-down signal DLYDN. The second delay circuit 123 may also delay the second clock signal CLK1B to generate a fourth clock signal DCLK1B. The first flip-flop 124 may sample the first clock signal CLK1 in response to the third clock signal DCLK1 to generate the first sample data SD. The second flip-flop 125 may sample the second clock signal CLK1B in response to the fourth clock signal DCLK1B to generate the second sample data SDB. The control circuit 126 may detect the duty of the output clock signal CLKOUT based on logic states of the first sample data SD and the second sample data SDB to generate the delay-up signal DLYUP, the delay-down signal DLYDN, the duty-up signal DUP and the duty-down signal DDN.

The control circuit 126 may include a delay control circuit 128 and a duty control circuit 127. The delay control circuit 128 may generate the delay-up signal DLYUP and the delay-down signal DLYDN based on logic states of the first sample data SD and the second sample data SDB. The duty control circuit 127 may generate the duty-up signal DUP and the duty-down signal DDN based on logic states of the first sample data SD and the second sample data SDB.

Figures 3, 4:
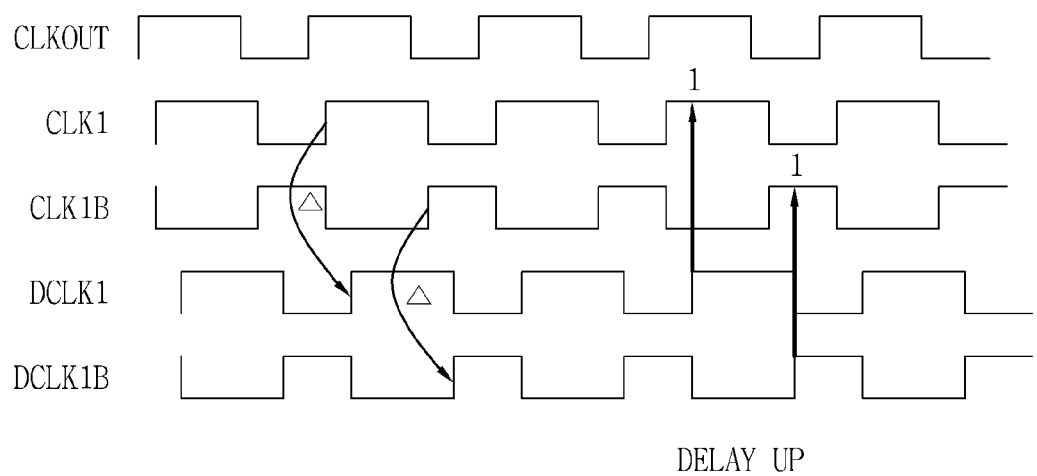
FIG. 3 is a truth table illustrating operation of a control circuit included in the duty detector of FIG. 2.
FIGS. 4 to 8 are timing diagrams illustrating operation of the duty detector of FIG. 2.

FIG. 3 is a truth table illustrating operation of the control circuit 126 included in the duty detector 120a of FIG. 2.

Referring to FIG. 3, if the first sample data SD and the second sample data SDB are enabled (e.g., 1), the control circuit 126 may generate (shown as CONTROL) the delay-up signal DLYUP to increase the delay time of the output clock signal CLKOUT. If the first sample data SD and the second sample data SDB are disabled (e.g., 0), the control circuit 126 may generate the delay-down signal DLYDN to decrease the delay time of the output clock signal CLKOUT.

Further, if the first sample data SD is disabled and the second sample data SDB is enabled, the control circuit 126 may generate the duty-up signal DUP to increase the duty of the output clock signal CLKOUT.

Further, if the first sample data SD is enabled and the second sample data SDB is disabled, the control circuit 126 may generate the duty-down signal DDN to decrease the duty of the output clock signal CLKOUT.

FIGS. 4 to 8 are timing diagrams illustrating operation of the duty detector of FIG. 2.

FIG. 4 illustrates operation of the duty detector 120a if the first sample data SD and the second sample data SDB are enabled.

Referring to FIG. 4, if each of the first clock signal CLK1 and the second clock signal CLK1B is delayed by a minimum delay amount (shown as Δ), the first sample data SD and the second sample data SDB are enabled. In this condition, the duty detector 120a may generate the delay-up signal DLYUP to increase the delay time of the output clock signal CLKOUT.

Figure 5:
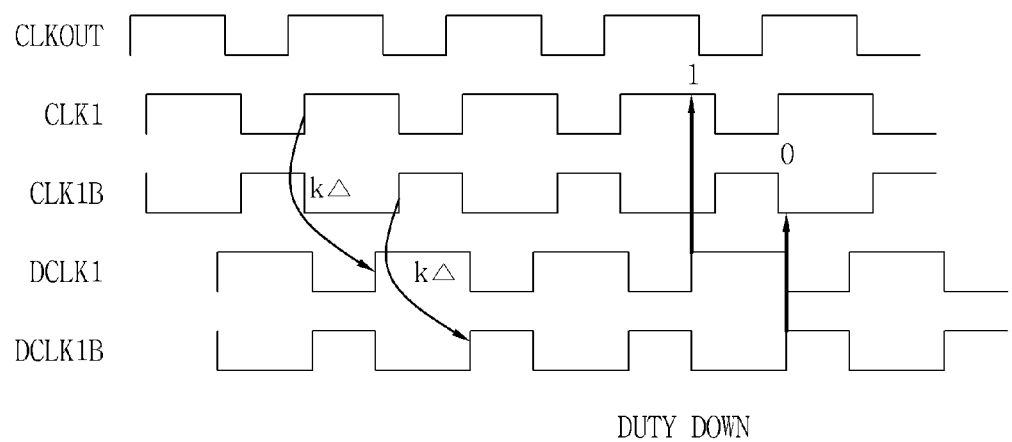

FIG. 5 illustrates operation of the duty detector 120a if the first sample data SD is enabled and the second sample data SDB is disabled.

Referring to FIG. 5, if a delay amount (shown as kΔ) of each of the first clock signal CLK1 and the second clock signal CLK1B is increased (e.g., k) from the delay amount shown in FIG. 4, the first sample data SD is enabled and the second sample data SDB is disabled. In this condition, the duty detector 120a may generate the duty-down signal DDN to decrease the duty of the output clock signal CLKOUT.

Figure 6:
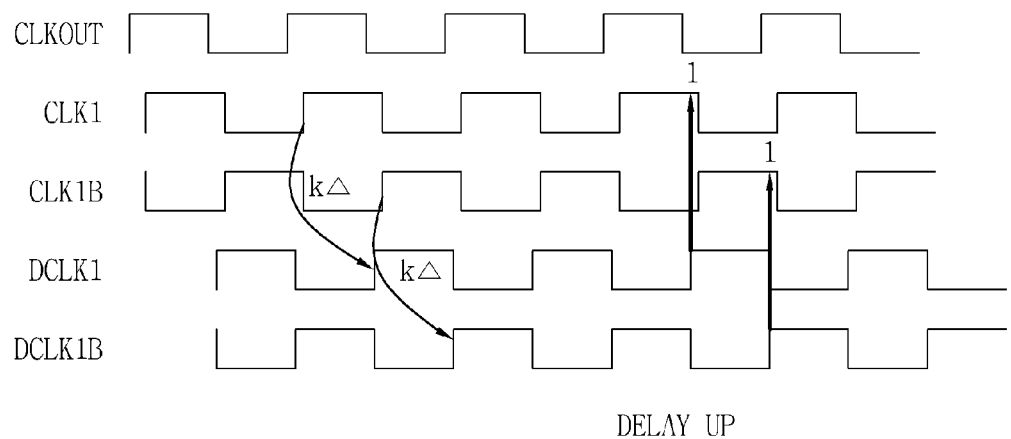

FIG. 6 illustrates operation of the duty detector 120a if the first sample data SD and the second sample data SDB are enabled.

Referring to FIG. 6, if a delay amount (shown as Δ) of each of the first clock signal CLK1 and the second clock signal CLK1B is decreased (shown as k) from the delay amount shown in FIG. 5, the first sample data SD and the second sample data SDB are enabled. In this condition, the duty detector 120a may generate the delay-up signal DLYUP to increase the delay amount of the output clock signal CLKOUT.

Figure 7:
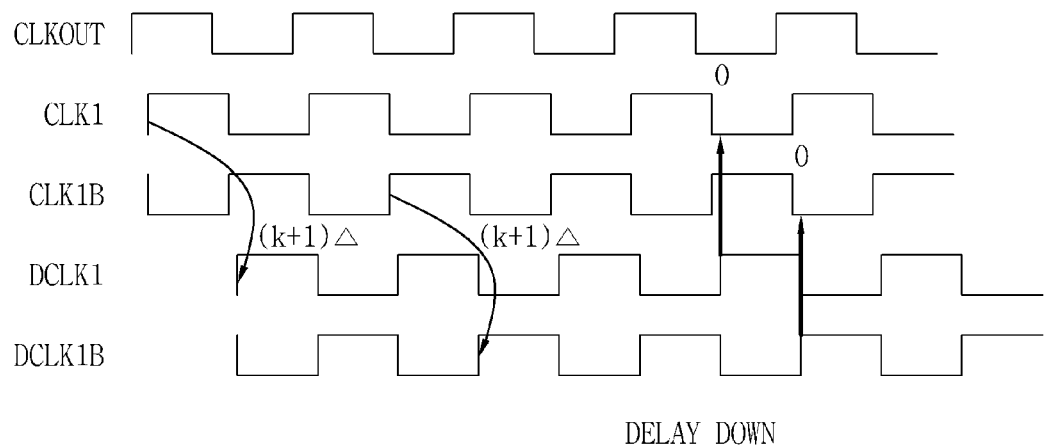

FIG. 7 illustrates operation of the duty detector 120a when the first sample data SD and the second sample data SDB are disabled.

Referring to FIG. 7, if a delay amount (shown as (k+1) Δ) of each of the first clock signal CLK1 and the second clock signal CLK1B is increased (shown as k+1) from the delay amount shown in FIG. 5, the first sample data SD and the second sample data SDB are disabled. In this condition, the duty detector 120a may generate the delay-down signal DLYDN to decrease the delay amount of the output clock signal CLKOUT.

Figure 8:
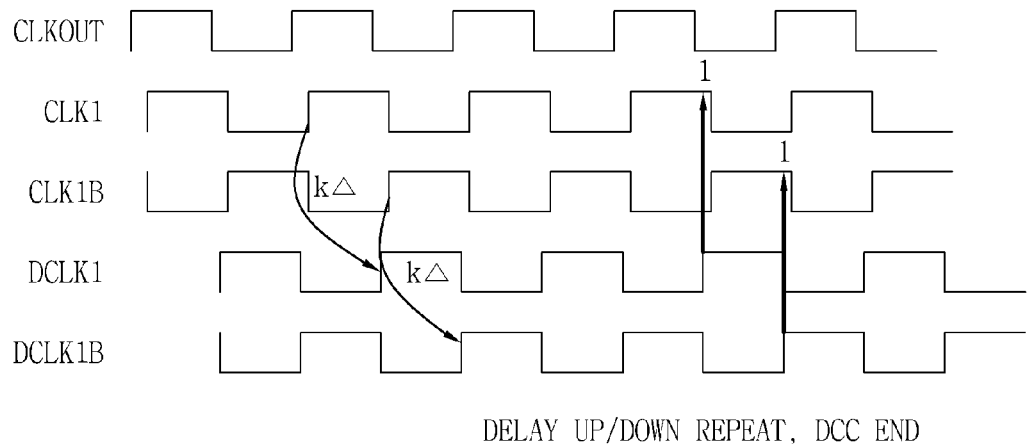

FIG. 8 illustrates operation of the duty detector 120a if the first sample data SD and the second sample data SDB are enabled.

Referring to FIG. 8, if a delay amount (shown as kΔ) of each of the first clock signal CLK1 and the second clock signal CLK1B is decreased (shown as k) from the delay amount shown in FIG. 7, the first sample data SD and the second sample data SDB are enabled. In this condition, the duty detector 120a may generate the delay-up signal DLYUP to increase the delay amount of the output clock signal CLKOUT.

The duty correcting circuit 100 of FIG. 1, as illustrated in the timing diagrams shown in FIG. 4 through FIG. 8, may correct duty of the output clock signal CLKOUT by performing operations of delay-up, delay-down, duty-up and duty-down repeatedly. Further, the duty correcting circuit 100 of FIG. 1 may correct the duty of the output clock signal CLKOUT by performing self-tracking for a half clock period.

Figure 9:
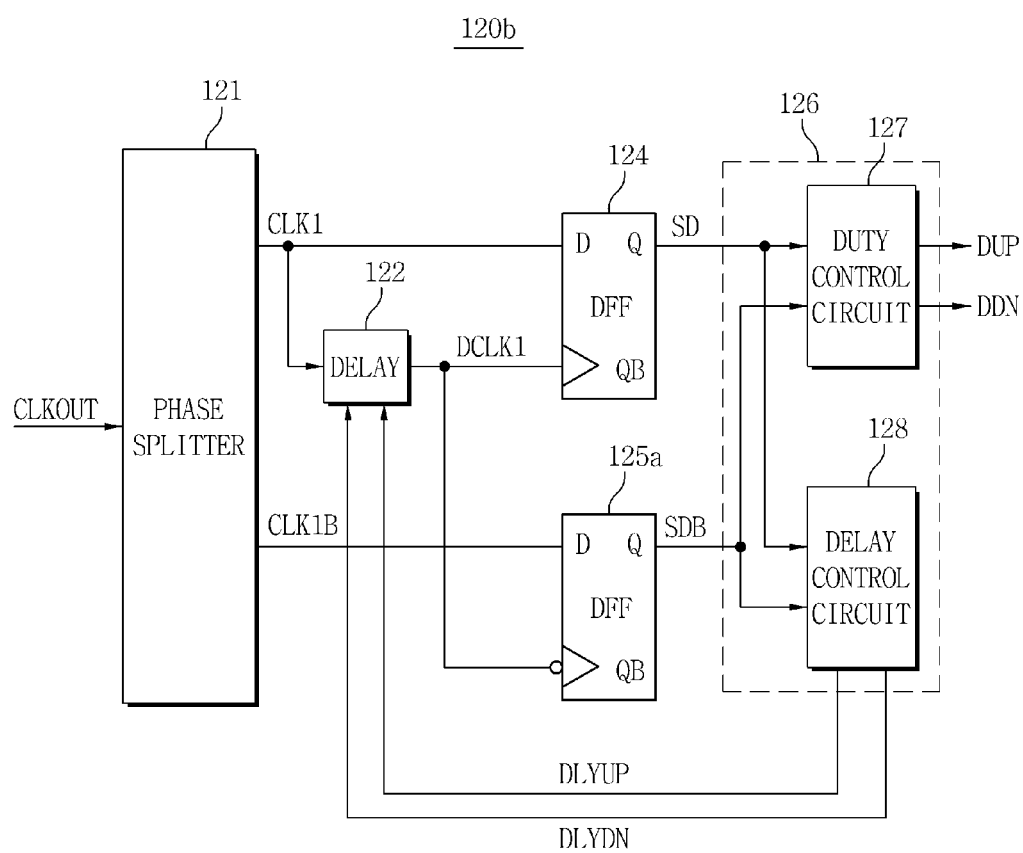
FIG. 9 is a circuit diagram of another example of a duty detector included in the duty correcting circuit of FIG. 1.

FIG. 9 is a circuit diagram of another example of the duty detector 120 included in the duty correcting circuit 100 of FIG. 1.

Referring to FIG. 9, the duty detector 120b may include a phase splitter 121, a first delay circuit 122, a first flip-flop 124, a third flip-flop 125a and a control circuit 126.

The phase splitter 121 may split a phase of the output clock signal CLKOUT to generate a first clock signal CLK1 and a second clock signal CLK1B having a phase difference of 180° from the first clock signal. The first delay circuit 122 may adjust a delay amount in response to a delay-up signal DLYUP and a delay-down signal DLYDN. The first delay circuit 122 may also delay the first clock signal CLK1 to generate a third clock signal DCLK1. The first flip-flop 124 may sample the first clock signal CLK1 in response to a rising edge of the third clock signal DCLK1 to generate the first sample data SD. The third flip-flop 125a may sample the second clock signal CLK1B in response to a falling edge of the third clock signal DCLK1 to generate the second sample data SDB. The control circuit 126 may detect the duty of the output clock signal CLKOUT based on logic states of the first sample data SD and the second sample data SDB to generate the delay-up signal DLYUP, the delay-down signal DLYDN, the duty-up signal DUP and the duty-down signal DDN. As shown in FIG. 2, the control circuit 126 may also include a delay control circuit 128 and a duty control circuit 127.

Figure 10:
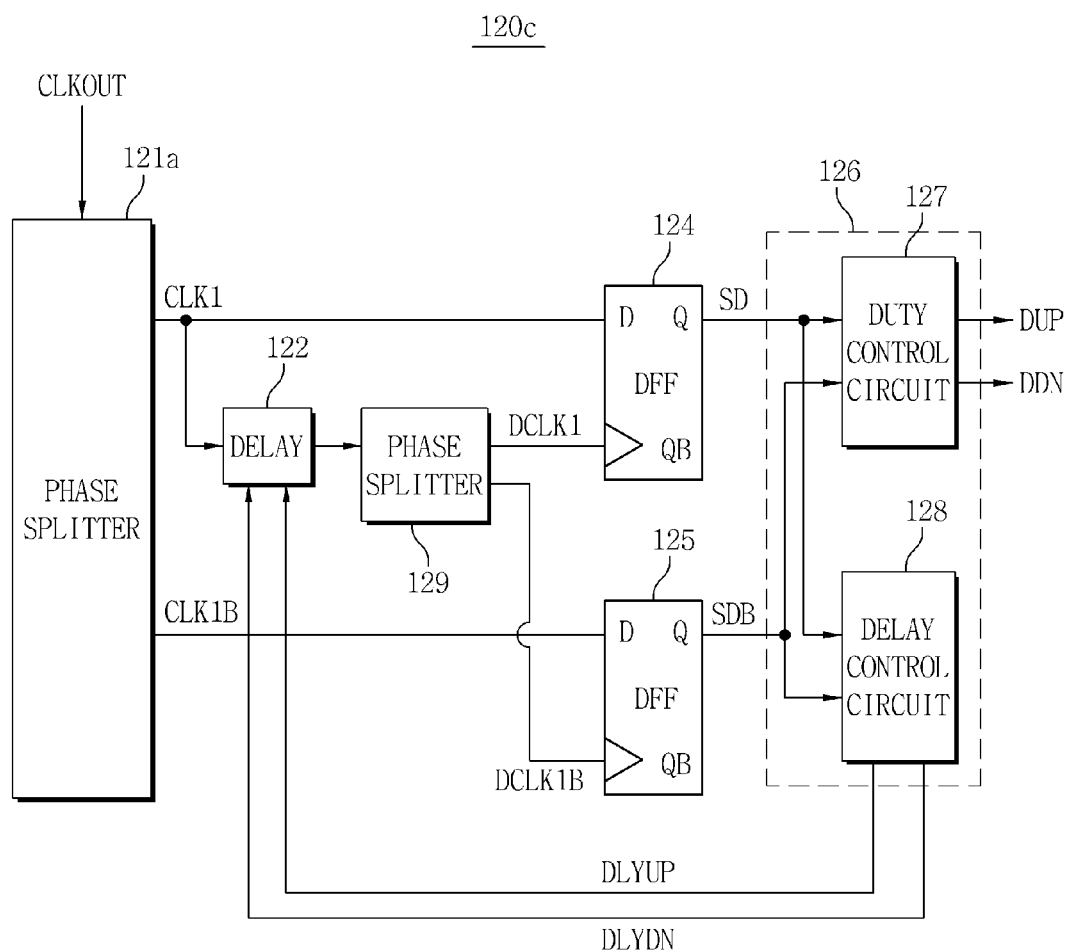
FIG. 10 is a circuit diagram of still another example of a duty detector included in the duty correcting circuit of FIG. 1.

FIG. 10 is a circuit diagram of still another example of the duty detector 120 included in the duty correcting circuit 100 of FIG. 1.

Referring to FIG. 10, the duty detector 120c may include a first phase splitter 121a, a first delay circuit 122, a second phase splitter 129, a first flip-flop 124, a second flip-flop 125 and a control circuit 126.

The first phase splitter 121a may split a phase of the output clock signal CLKOUT to generate a first clock signal CLK1 and a second clock signal CLK1B having a phase difference of 180° from the first clock signal. The first delay circuit 122 may adjust a delay amount in response to a delay-up signal DLYUP and a delay-down signal DLYDN. The first delay circuit 122 may also delay the first clock signal CLK1. The second phase splitter 129 may split a phase of an output signal of the first delay circuit 122 to generate a third clock signal DCLK1 and a fourth clock signal DCLK1B having a phase difference of 180° from the third clock signal DCLK1. The first flip-flop 124 may sample the first clock signal CLK1 in response to the third clock signal DCLK1 to generate the first sample data SD. The second flip-flop 125 may sample the second clock signal CLK1B in response to the fourth clock signal DCLK1B to generate the second sample data SDB. The control circuit 126 may detect the duty of the output clock signal CLKOUT based on logic states of the first sample data SD and the second sample data SDB to generate the delay-up signal DLYUP, the delay-down signal DLYDN, the duty-up signal DUP and the duty-down signal DDN. As shown in FIG. 2, the control circuit 126 may also include a delay control circuit 128 and a duty control circuit 127.

Figure 11:
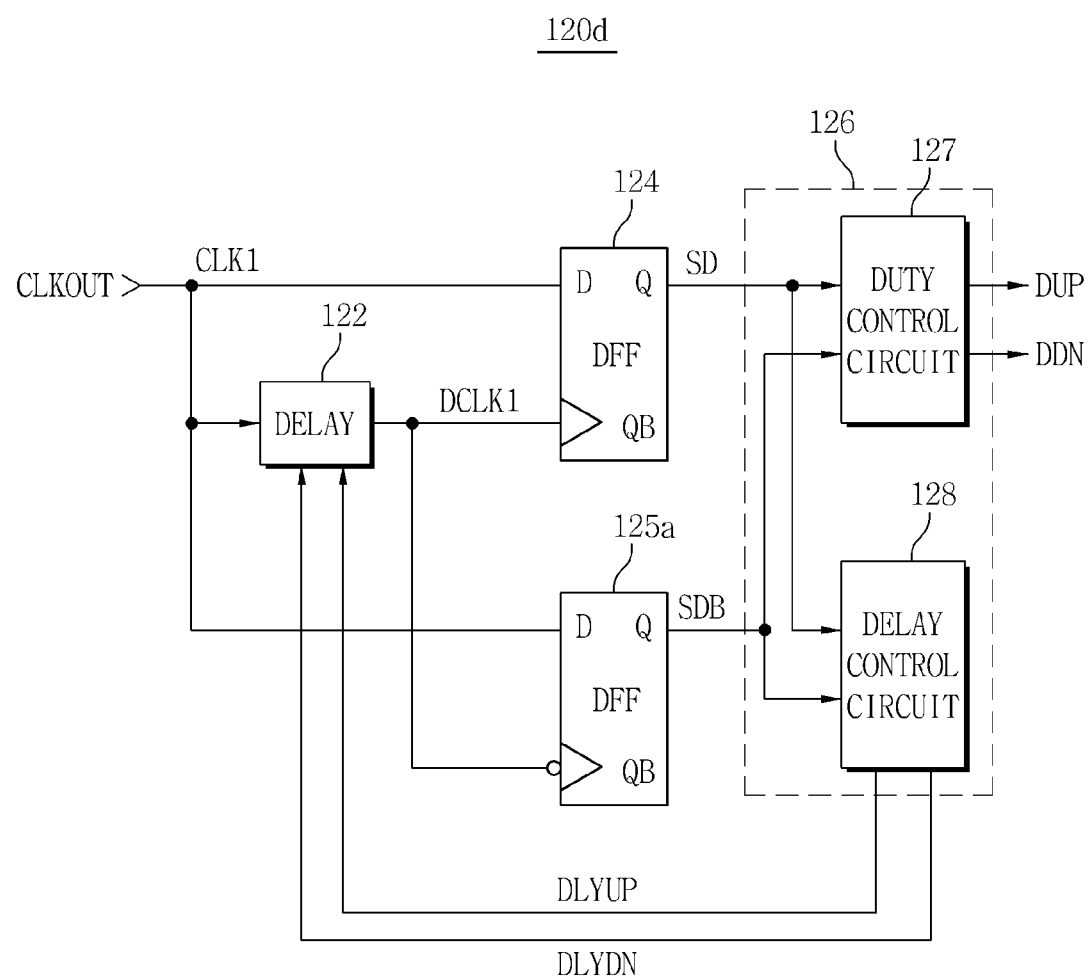
FIG. 11 is a circuit diagram of yet another example of a duty detector included in the duty correcting circuit of FIG. 1.

FIG. 11 is a circuit diagram of yet another example of the duty detector 120 included in the duty correcting circuit 100 of FIG. 1.

Referring to FIG. 11, the duty detector 120d may include a first delay circuit 122, a first flip-flop 124, a third flip-flop 125a and a control circuit 126.

The first delay circuit 122 may adjust a delay amount in response to a delay-up signal DLYUP and a delay-down signal DLYDN. The first delay circuit 122 may also delay the first clock signal CLK1 corresponding to the output clock signal CLKOUT to generate a third clock signal DCLK1. The first flip-flop 124 may sample the first clock signal CLK1 in response to a rising edge of the third clock signal DCLK1 to generate the first sample data SD. The third flip-flop 125a may sample the first clock signal CLK1 in response to a falling edge of the third clock signal DCLK1 to generate the second sample data SDB. The control circuit 126 may detect the duty of the output clock signal CLKOUT based on logic states of the first sample data SD and the second sample data SDB to generate the delay-up signal DLYUP, the delay-down signal DLYDN, the duty-up signal DUP and the duty-down signal DDN. As shown in FIG. 2, the control circuit 126 may also include a delay control circuit 128 and a duty control circuit 127.

Figure 12:
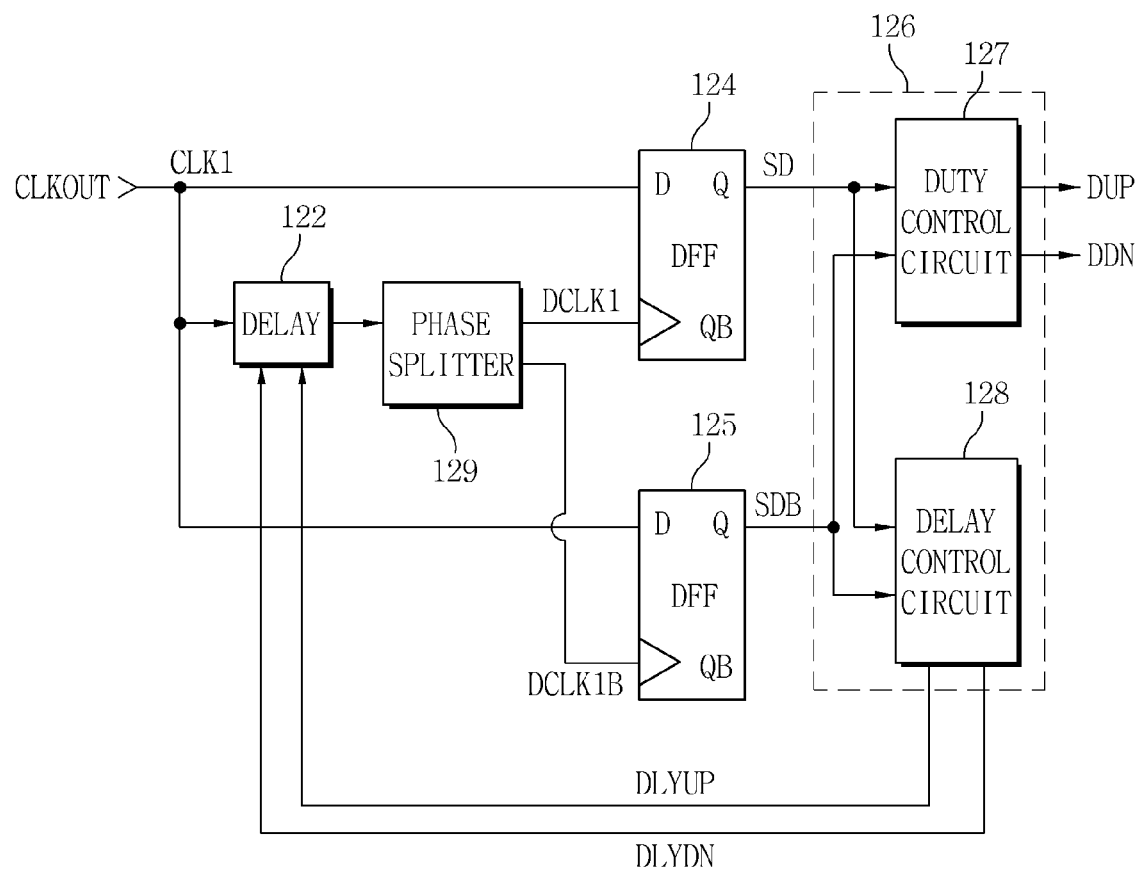
FIG. 12 is a circuit diagram of yet another example of a duty detector included in the duty correcting circuit of FIG. 1.

FIG. 12 is a circuit diagram of yet another example of the duty detector 120 included in the duty correcting circuit 100 of FIG. 1.

Referring to FIG. 12, the duty detector 120e may include a first delay circuit 122, a phase splitter 129, a first flip-flop 124, a second flip-flop 125 and a control circuit 126.

The first delay circuit 122 may adjust a delay amount in response to a delay-up signal DLYUP and a delay-down signal DLYDN. The first delay circuit 122 may also delay the first clock signal CLK1 corresponding to the output clock signal CLKOUT. The phase splitter 129 may split a phase of an output signal of the first delay circuit 122 to generate a third clock signal DCLK1 and a fourth clock signal DCLK1B having a phase difference of 180° from the third clock signal DCLK1. The first flip-flop 124 may sample the first clock signal CLK1 in response to the third clock signal DCLK1 to generate the first sample data SD. The second flip-flop 125 may sample the second clock signal CLK1B in response to the fourth clock signal DCLK1B to generate the second sample data SDB. The control circuit 126 may detect the duty of the output clock signal CLKOUT based on logic states of the first sample data SD and the second sample data SDB to generate the delay-up signal DLYUP, the delay-down signal DLYDN, the duty-up signal DUP and the duty-down signal DDN. As shown in FIG. 2, the control circuit 126 may also include a delay control circuit 128 and a duty control circuit 127.

Figure 13:
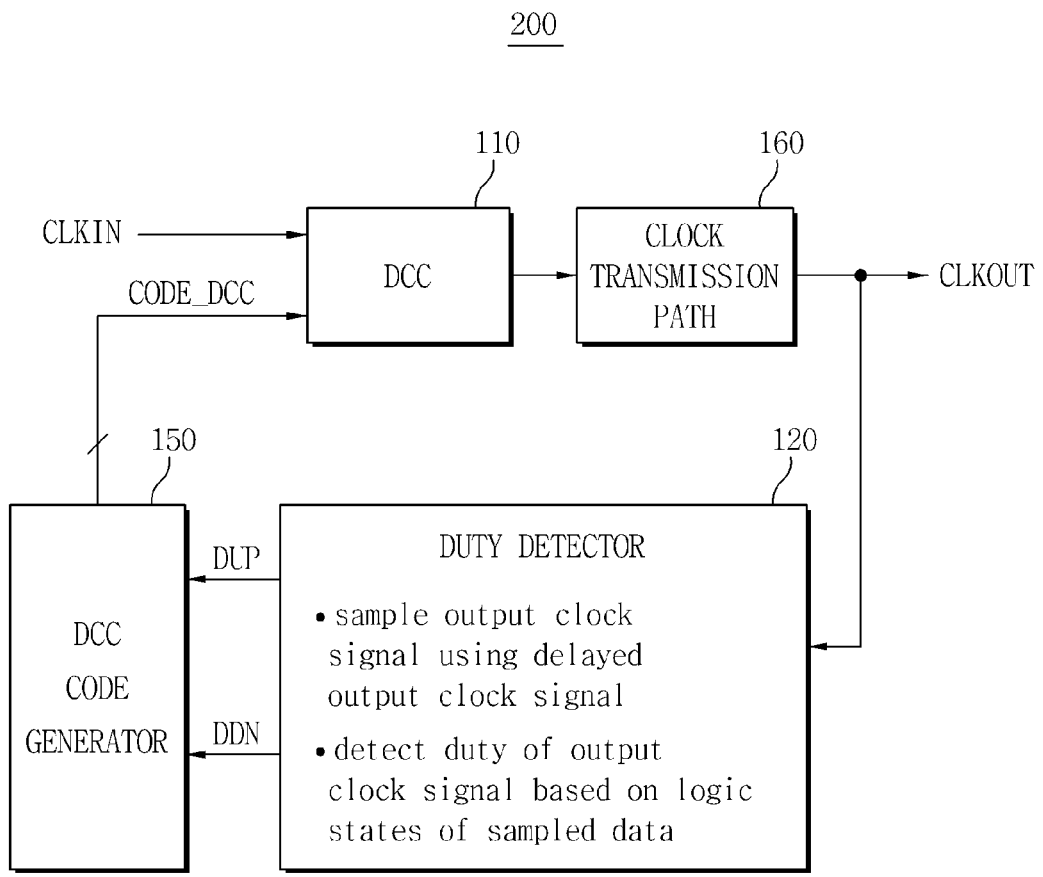
FIG. 13 is a block diagram of another duty correcting circuit according to example embodiments of inventive concepts.

FIG. 13 is a block diagram of another duty correcting circuit 200 according to example embodiments of inventive concepts. Referring to FIG. 13, the duty correcting circuit 200 may include a duty cycle corrector 110, a duty detector 120, a duty correction code generator 150 and a clock transmission path 160.

The duty cycle corrector 110 may correct a duty cycle of an input clock signal CLKIN in response to a duty correction code CODE_DCC to generate an output clock signal CLKOUT. The clock transmission path 160 may include buffer circuits and/or latch circuits. The clock transmission path 160 may be communicatively between the duty cycle corrector 110 and the duty detector 120. The duty detector 120 may adjust a delay time of the output clock signal CLKOUT to generate a sampling clock signal. The duty detector 120 may also sample the output clock signal CLKOUT in response to the sampling clock signal to generate first sample data and second sample data. The duty detector 120 may also detect a duty of the output clock signal CLKOUT based on logic states of the first sample data and the second sample data to generate a duty-up signal DUP and a duty-down signal DDN. The duty correction code generator 150 may generate the duty correction code CODE_DCC in response to the duty-up signal DUP and the duty-down signal DDN.

Figure 14:
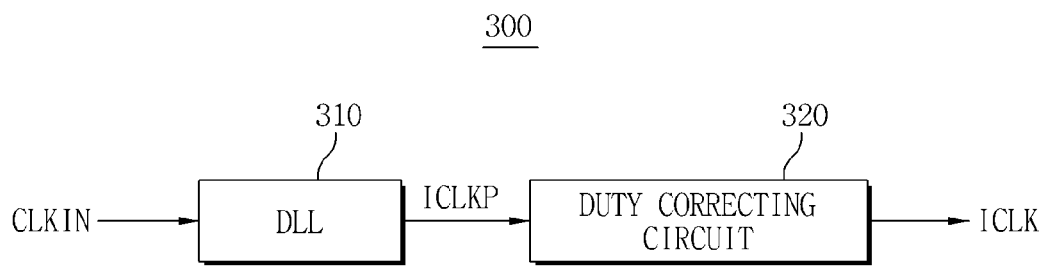
FIG. 14 is a block diagram of an example of a delay-locked-loop (DLL) circuit including a duty correcting circuit according to example embodiments of inventive concepts.

FIG. 14 is a block diagram of an example of a DLL circuit 300 including a duty correcting circuit according to example embodiments of inventive concepts.

Referring to FIG. 14, the DLL circuit 300 may include a DLL circuit 310 and a duty correcting circuit 320. The DLL circuit 310 may generate a first internal clock signal ICLKP synchronized with an external clock signal CLKIN. The duty correcting circuit 320 may correct a duty of the first internal clock signal ICLKP to generate a second internal clock signal ICLK. The duty correcting circuit 320 may have circuit structures according to example embodiments of inventive concepts.

The duty correcting circuit 320 may include a duty detector according to example embodiments of inventive concepts. The duty correcting circuit 320 may adjust a delay time of a sampling clock signal in a digital mode based on logic states of sampled data. The duty correcting circuit 320 may detect a duty of an output clock signal. Therefore, the duty correcting circuit 320 according to example embodiments of inventive concepts may detect a duty of the output clock signal, and may generate an output clock signal having a duty ratio of 50:50, e.g., a duty ratio of 50%.

Figure 15:
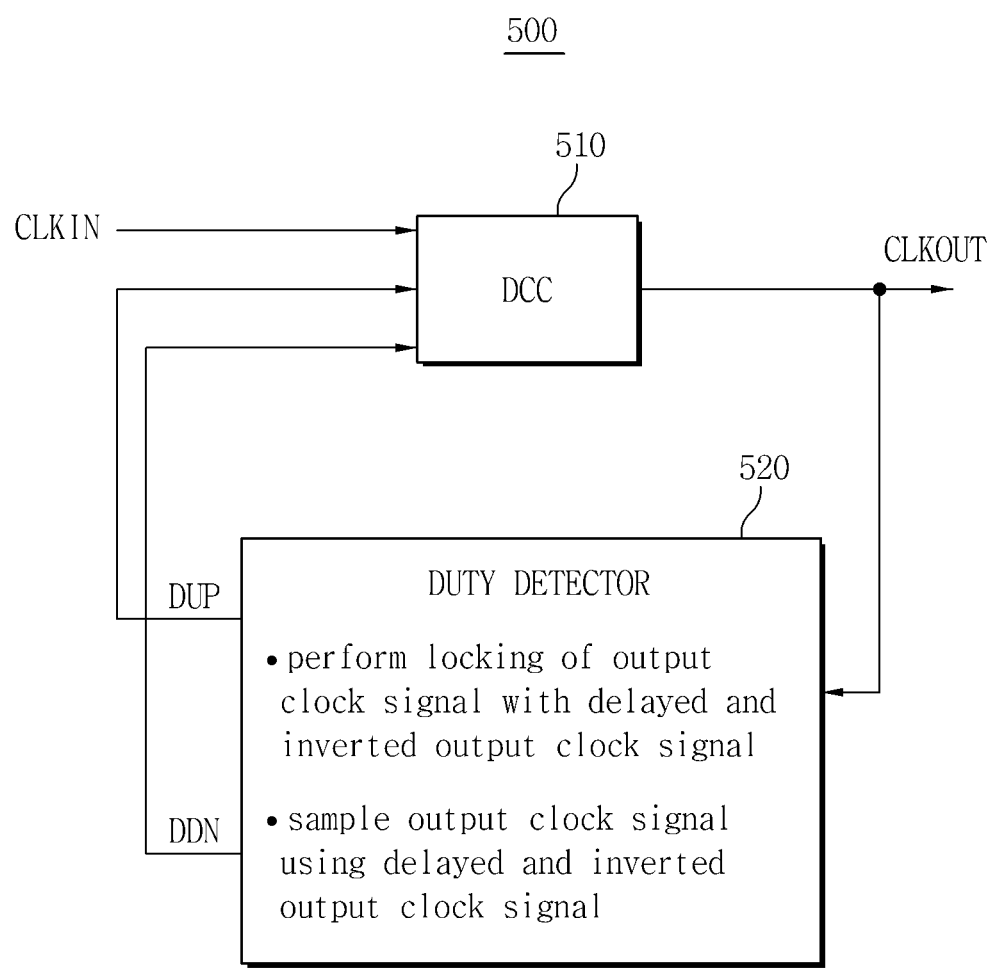
FIG. 15 is a block diagram of still another duty correcting circuit according to example embodiments of the inventive concepts.

FIG. 15 is a block diagram of still another duty correcting circuit 500 according to example embodiments of inventive concepts.

Referring to FIG. 15, the duty correcting circuit 500 includes a duty cycle corrector 510 and a duty detector 520.

The duty cycle corrector 510 may correct a duty cycle of an input clock signal CLKIN in response to a duty-up signal DUP and a duty-down signal DDN to generate an output clock signal CLKOUT. The duty detector 520 may delay the output clock signal CLKOUT to generate a delayed output clock signal, inverts a phase of the delayed output clock signal to generate an inverted and delayed output clock signal. The duty detector 520 may also synchronize the output clock signal to the inverted and delayed output clock signal. The duty detector 520 may also sample the output clock signal in response to the inverted and delayed output clock signal to generate first sample data and second sample data. The duty detector 520 may also detect a duty of the output clock signal based on logic states of the first sample data and the second sample data to generate the duty-up signal DUP and the duty-down signal DDN.

The duty detector 520 may adjust a delay time of the output clock signal CLKOUT based on a logic state of the first sample data which is the output clock signal sampled at a rising edge of the inverted and delayed output clock signal. The duty detector 520 may also detect a duty of the output clock signal CLKOUT based on a logic state of the second sample data which is the output clock signal sampled at a falling edge of the inverted and delayed output clock signal. The duty detector 520 may also adjust a delay time of the output clock signal CLKOUT using a delay line of a DLL circuit.

Figure 16:
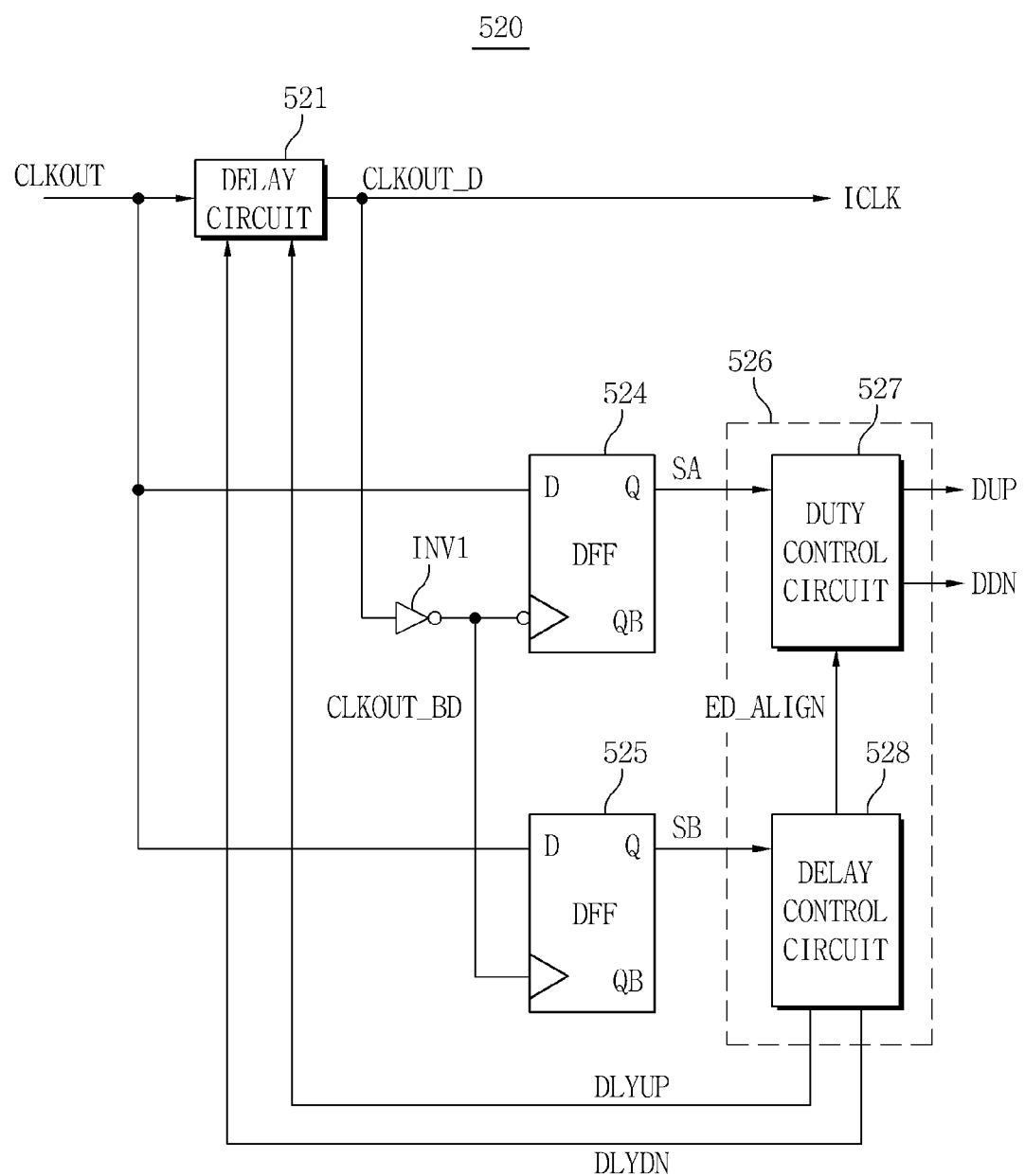
FIG. 16 is a circuit diagram of an example of a duty detector included in the duty correcting circuit of FIG. 15.

FIG. 16 is a circuit diagram of an example of a duty detector 520 included in the duty correcting circuit 500 of FIG. 15.

Referring to FIG. 16, the duty detector 520 may include a delay circuit 521, an inverter INV1, a first flip-flop 524, a second flip-flop 525 and a control circuit 526. The delay circuit 521 may delay the output clock signal CLKOUT in response to a delay-up signal DLYUP and a delay-down signal DLYDN to generate the delayed output clock signal CLKOUT_D and an internal clock signal ICLK. The inverter INV1 may invert the delayed output clock signal CLKOUT_D to generate the inverted and delayed output clock signal CLKOUT_BD. The first flip-flop 524 may sample the output clock signal CLKOUT in response to a falling edge of the inverted and delayed output clock signal CLKOUT_BD to generate first sample data SA. The second flip-flop 525 may sample the output clock signal CLKOUT in response to a rising edge of the inverted and delayed output clock signal CLKOUT_BD to generate second sample data SB. The control circuit 526 may generate the delay-up signal DLYUP, the delay-down signal DLYDN, the duty-up signal DUP and the duty-down signal DDN based on logic states of the first sample data SA and the second sample data SB.

The control circuit 526 may include a delay control circuit 528 and a duty control circuit 527. The delay control circuit 528 may generate the delay-up signal DLYUP, the delay-down signal DLYDN and an output enable signal ED_ALIGN based on a logic state of the second sample data SB. The duty control circuit 527 may generate the duty-up signal DUP and the duty-down signal DDN based on logic states of the output enable signal ED_ALIGN and the first sample data SA.

The duty detector 520 may generate the delay-up signal DLYUP to increase the delay time of the output clock signal CLKOUT if the second sample data SB has a logic low state. The duty detector 520 may generate the delay-down signal DLYDN to decrease the delay time of the output clock signal CLKOUT if the second sample data SB has a logic high state.

Further, the duty detector 520 may generate the duty-up signal DUP to increase the duty of the output clock signal CLKOUT if an output enable signal ED_ALIGN is enabled and the first sample data SA has a logic low state. The duty detector 520 may also generate the duty-down signal DDN to decrease the duty of the output clock signal CLKOUT if the output enable signal ED_ALIGN is enabled and the first sample data SA has a logic high state.

In FIG. 16, the delay circuit 521 may be a delay line of a DLL circuit.

Figure 17:
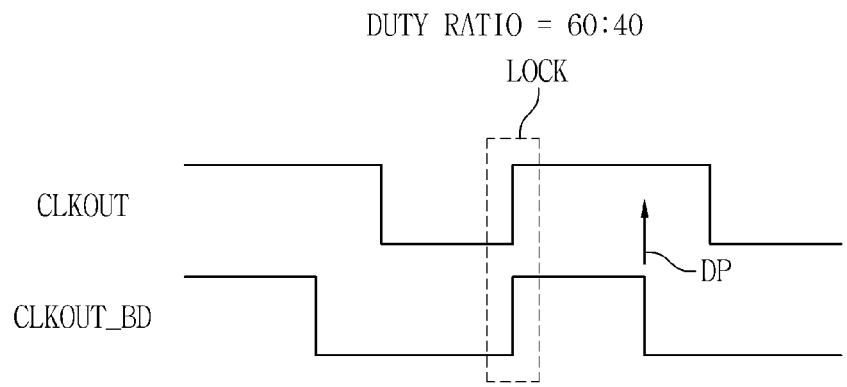
FIGS. 17 to 19 are timing diagrams illustrating logic states of an output clock signal at a detecting time point according to duty ratio when synchronization between the output clock signal and an inverted and delayed output clock signal is completed.
Figure 18:
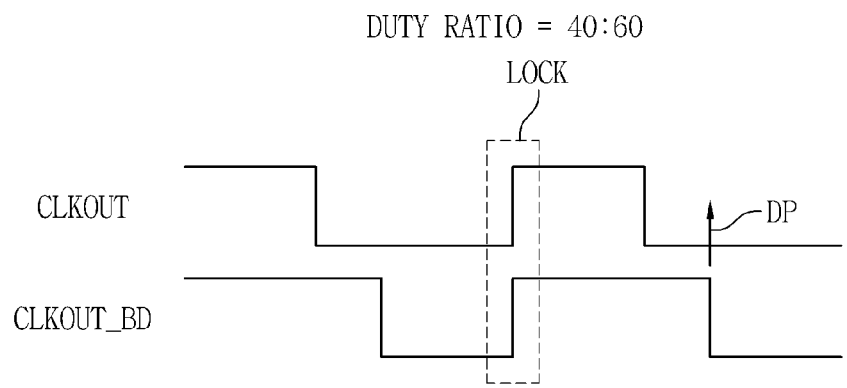
Figure 19:
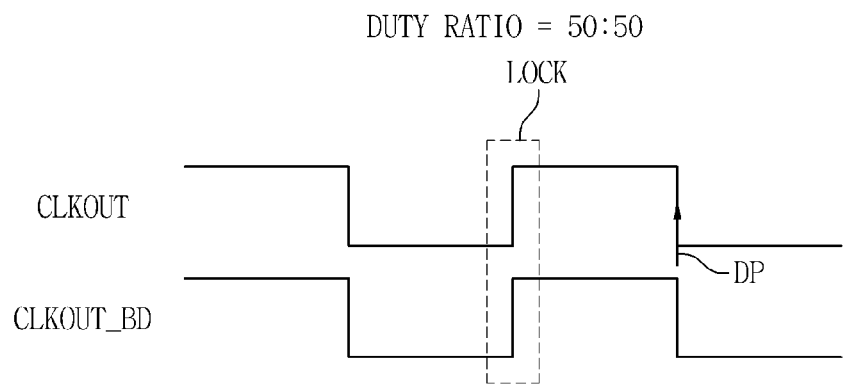

FIGS. 17 to 19 are timing diagrams illustrating logic states of an output clock signal at a detecting time point according to duty ratio when synchronization (shown as LOCK) between the output clock signal CLKOUT and an inverted and delayed output clock signal CLKOUT_BD is completed.

FIG. 17 illustrates a logic state of the output clock signal CLKOUT at a detecting time point DP when synchronization between the output clock signal CLKOUT and the inverted and delayed output clock signal CLKOUT_BD is completed in case of a duty ratio of 60:40, e.g., a duty ratio of 60%. FIG. 18 illustrates a logic state of the output clock signal CLKOUT at a detecting time point DP when synchronization between the output clock signal CLKOUT and the inverted and delayed output clock signal CLKOUT_BD is completed in case of a duty ratio of 40:60, e.g., a duty ratio of 40%. FIG. 19 illustrates a logic state of the output clock signal CLKOUT at a detecting time point DP when synchronization between the output clock signal CLKOUT and the inverted and delayed output clock signal CLKOUT_BD is completed in case of a duty ratio of 50:50, e.g., a duty ratio of 50%.

Referring to the timing diagram of FIG. 17, the output clock signal CLKOUT has a logic high state at a detecting time point DP when synchronization between the output clock signal CLKOUT and the inverted and delayed output clock signal CLKOUT_BD is completed. Referring to the timing diagram of FIG. 18, the output clock signal CLKOUT has a logic low state at a detecting time point DP when synchronization between the output clock signal CLKOUT and the inverted and delayed output clock signal CLKOUT_BD is completed. Referring to the timing diagram of FIG. 19, the output clock signal CLKOUT has a logic low state and logic high state alternately at a detecting time point DP when synchronization between the output clock signal CLKOUT and the inverted and delayed output clock signal CLKOUT_BD is completed and the duty ratio is about 50:50. In this condition, it can be seen that the duty correction is completed by the duty correcting circuit 100.

FIG. 20 is a truth table illustrating operation of a control circuit 526 included in the duty detector 520 of FIG. 16

Referring to FIG. 20, the duty detector 520 may generate the delay-up signal DLYUP to increase a delay time if the second sample data SB has a logic low state. The duty detector 520 may generate the delay-down signal DLYDN to decrease a delay time if the second sample data SB has a logic high state. Further, the duty detector 520 may generate the duty-up signal DUP to increase the duty if the output enable signal ED_ALIGN is enabled and the first sample data SA has a logic low state. The duty detector 520 may generate the duty-down signal DDN to decrease the duty when the output enable signal ED_ALIGN is enabled and the first sample data SA has a logic high state.

FIGS. 21 to 26 are timing diagrams illustrating operation of a duty detector 520 of FIG. 16. In FIGS. 21 to 26, waveforms of the output clock signal CLKOUT, the delayed output clock signal CLKOUT_D and the inverted and delayed output clock signal CLKOUT_BD are shown.

Figure 23:
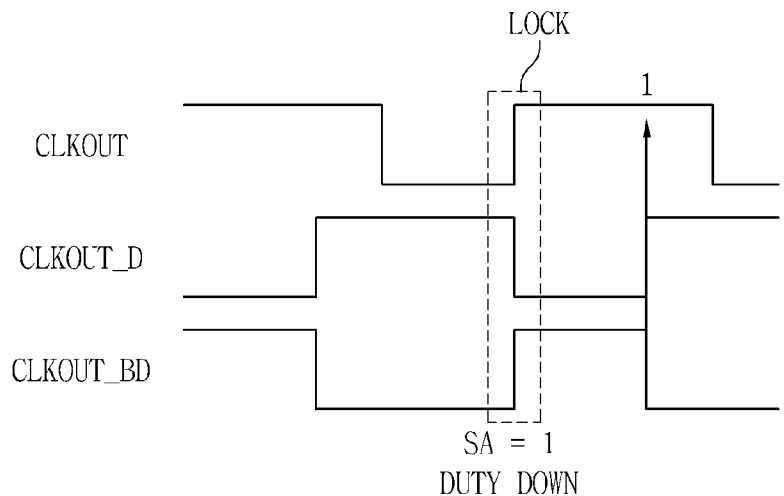
Figure 24:
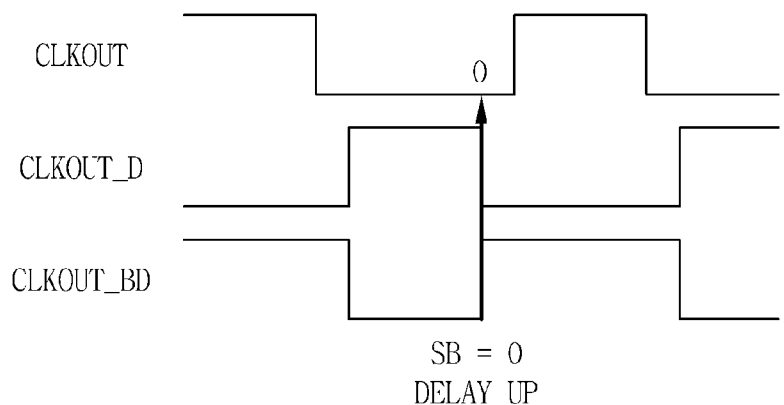
Figure 25:
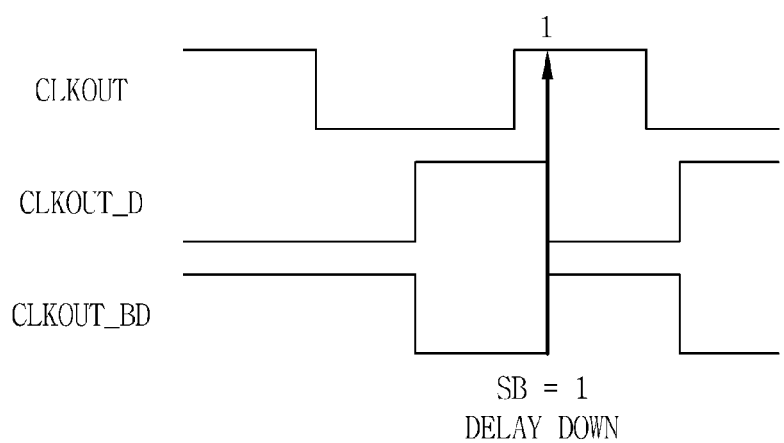
Figure 26:
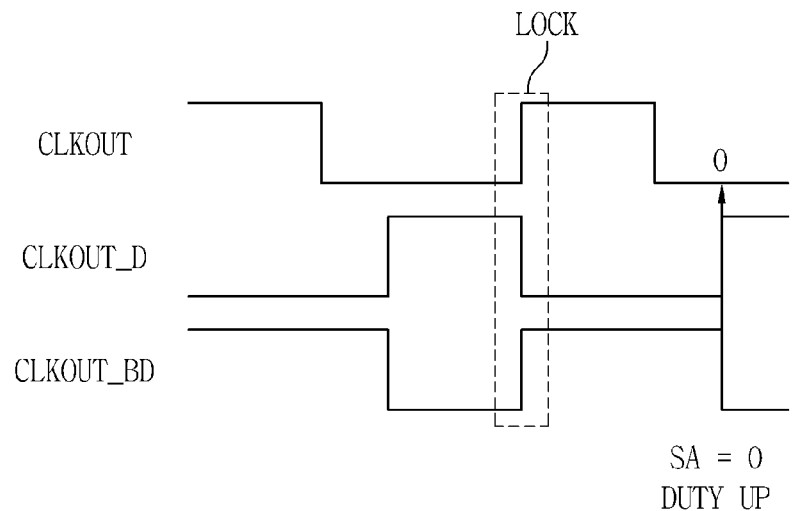

FIGS. 21 to 23 are timing diagrams illustrating operation of the duty detector 520 of FIG. 16 if the duration of a logic high state is longer than the duration of a logic low state. FIGS. 24 to 26 are timing diagrams illustrating operation of the duty detector 520 of FIG. 16 if the duration of a logic high state is shorter than the duration of a logic low state.

Referring to FIG. 21, the rising edge of the output clock signal CLKOUT and the rising edge of the inverted and delayed output clock signal CLKOUT_BD are not locked, that is, the two signals are not synchronized with each other. The output clock signal CLKOUT detected at the rising edge of the inverted and delayed output clock signal CLKOUT_BD has a logic low state (SB=0). Therefore, the duty detector 520 may generate the delay-up signal DLYUP to increase the delay time.

Referring to FIG. 22, the rising edge of the output clock signal CLKOUT and the rising edge of the inverted and delayed output clock signal CLKOUT_BD are not locked. The output clock signal CLKOUT detected at the rising edge of the inverted and delayed output clock signal CLKOUT_BD has a logic high state (SB=1). Therefore, the duty detector 520 may generate the delay-down signal DLYDN to decrease the delay time.

Referring to FIG. 23, the rising edge of the output clock signal CLKOUT and the rising edge of the inverted and delayed output clock signal CLKOUT_BD are locked. The output clock signal CLKOUT detected at the falling edge of the inverted and delayed output clock signal CLKOUT_BD has a logic high state (SA=1). Therefore, the duty detector 520 may generate the duty-down signal DDN to decrease the duty.

Referring to FIG. 24, the rising edge of the output clock signal CLKOUT and the rising edge of the inverted and delayed output clock signal CLKOUT_BD are not locked. The output clock signal CLKOUT detected at the rising edge of the inverted and delayed output clock signal CLKOUT_BD has a logic low state (SB=0). Therefore, the duty detector 520 may generate the delay-up signal DLYUP to increase the delay time.

Referring to FIG. 25, the rising edge of the output clock signal CLKOUT and the rising edge of the inverted and delayed output clock signal CLKOUT_BD are not locked. The output clock signal CLKOUT detected at the rising edge of the inverted and delayed output clock signal CLKOUT_BD has a logic high state (SB=1). Therefore, the duty detector 520 may generate the delay-down signal DLYDN to decrease the delay time.

Referring to FIG. 26, the rising edge of the output clock signal CLKOUT and the rising edge of the inverted and delayed output clock signal CLKOUT_BD are locked (shown as LOCK). The output clock signal CLKOUT detected at the falling edge of the inverted and delayed output clock signal CLKOUT_BD has a logic low state (SA=0). Therefore, the duty detector 520 may generate the duty-up signal DUP to increase the duty.

Figure 27:
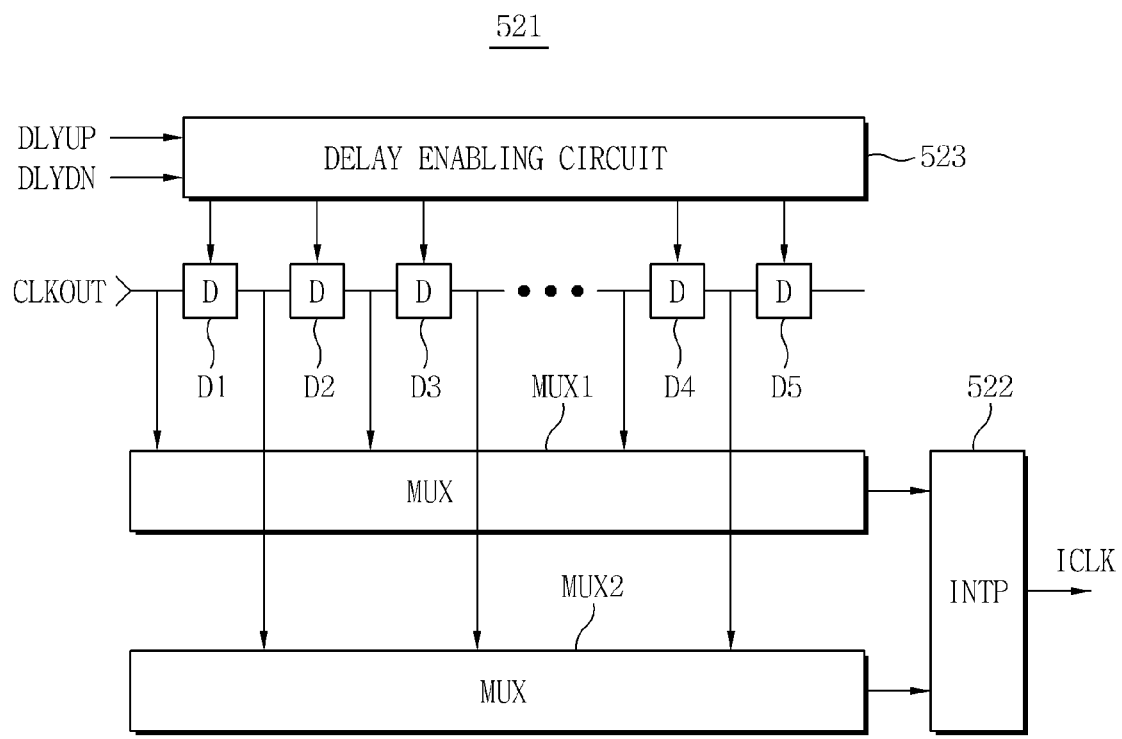
FIG. 27 is a circuit diagram of an example of a delay circuit included in the duty detector of FIG. 16.

FIG. 27 is a circuit diagram of an example of a delay circuit 521 included in the duty detector 520 of FIG. 16.

Referring to FIG. 27, the delay circuit 521 may include a delay enabling circuit 523, a delay unit including delays D1 to D5, multiplexers MUX1 and MUX2 and an interpolator 522.

The delay enabling circuit 523 may generate delay control signals based on the delay-up signal DLYUP and the delay-down signal DLYDN. Each of the delays D1 to D5 including the delay unit may be activated in response to the delay control signals, and delays the output clock signal CLKOUT by a delay amount D of each of the delays D1 to D5. For example, D1 delays the output clock signal CLKOUT by the delay amount D, and D3 delays an output signal of the delay D2 by the delay amount D. The first multiplexer MUX1 may select and output signals of input terminals of odd-numbered delays among the delays D1 to D5. The second multiplexer MUX2 may select and output signals of input terminals of even-numbered delays among the delays D1 to D5. The interpolator 522 may detect a value between an output signal of the first multiplexer MUX1 and the second multiplexer MUX2 and outputs the detected signal as an internal clock signal ICLK. For example, the interpolator 522 may perform interpolation on a signal of an input terminal of D1 and a signal of an input terminal of D2, delay the output clock signal CLKOUT by the delay time of a half of the delay amount D that each of the delays D1 to D5 has, and generate the internal clock signal ICLK.

Figure 28:
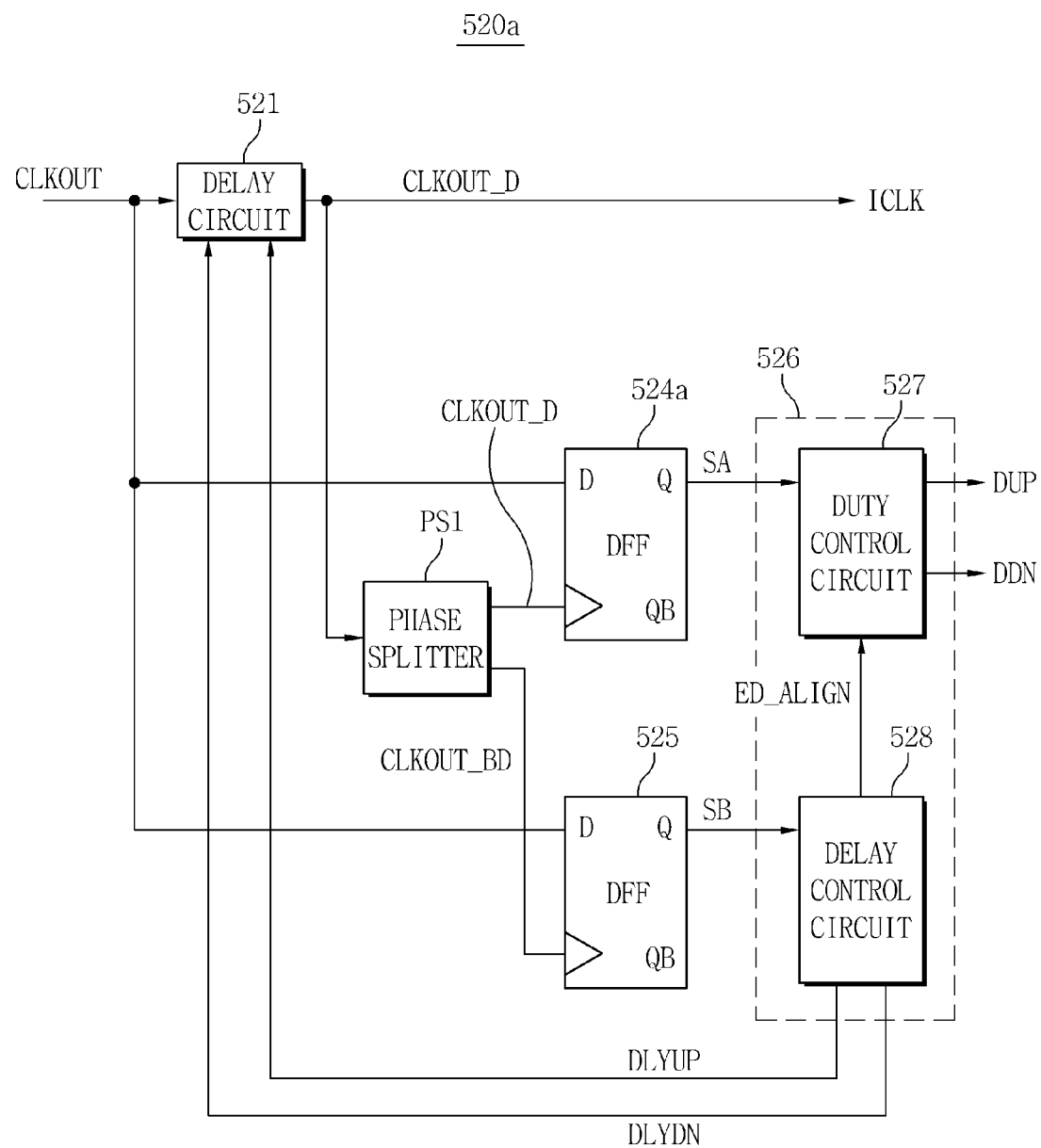
FIG. 28 is a circuit diagram of another example of a duty detector included in the duty correcting circuit of FIG. 15.

FIG. 28 is a circuit diagram of another example of a duty detector 520 included in the duty correcting circuit 500 of FIG. 15.

Referring to FIG. 28, the duty detector 520a may include a delay circuit 521, a phase splitter PS1, a first flip-flop 524a, a second flip-flop 525 and a control circuit 526. The delay circuit 521 may delay the output clock signal CLKOUT in response to a delay-up signal DLYUP and a delay-down signal DLYDN to generate the delayed output clock signal CLKOUT_D and the internal clock signal ICLK. The phase splitter PS1 may split a phase of the delayed output clock signal CLKOUT_D to generate the delayed output clock signal CLKOUT_D and an inverted and delayed output clock signal CLKOUT_BD having a phase difference of 180° from each other. The first flip-flop 524a may sample the output clock signal CLKOUT in response to a rising edge of the delayed output clock signal CLKOUT_D to generate the first sample data SA. The second flip-flop 525 may sample the output clock signal CLKOUT in response to a rising edge of the inverted and delayed output clock signal CLKOUT_BD to generate the second sample data SB. The control circuit 526 may generate the delay-up signal DLYUP, the delay-down signal DLYDN, the duty-up signal DUP and the duty-down signal DDN based on logic states of the first sample data SA and the second sample data SB.

The control circuit 526 may include a delay control circuit 528 and a duty control circuit 527. The delay control circuit 528 may generate the delay-up signal DLYUP, the delay-down signal DLYDN and an output enable signal ED_ALIGN based on a logic state of the second sample data SB. The duty control circuit 527 may generate the duty-up signal DUP and the duty-down signal DDN based on a logic state of the output enable signal ED_ALIGN and the first sample data SA.

The duty detector 520a of FIG. 28 may generate the delayed output clock signal CLKOUT_D and the inverted and delayed output clock signal CLKOUT_BD having a phase difference of 180° from each other using the phase splitter PS1 instead of the inverter INV1 included in the duty detector 520 of FIG. 16. Further, the first flip-flop 524a may sample the output clock signal CLKOUT in response to a rising edge of the delayed output clock signal CLKOUT_D to generate the first sample data SA.

The operation of the duty detector 520a of FIG. 28 is somewhat similar to that of the duty detector 520 of FIG. 16. Therefore, in the interest of brevity, the operation of the duty detector 520a will not be explained further.

Figure 29:
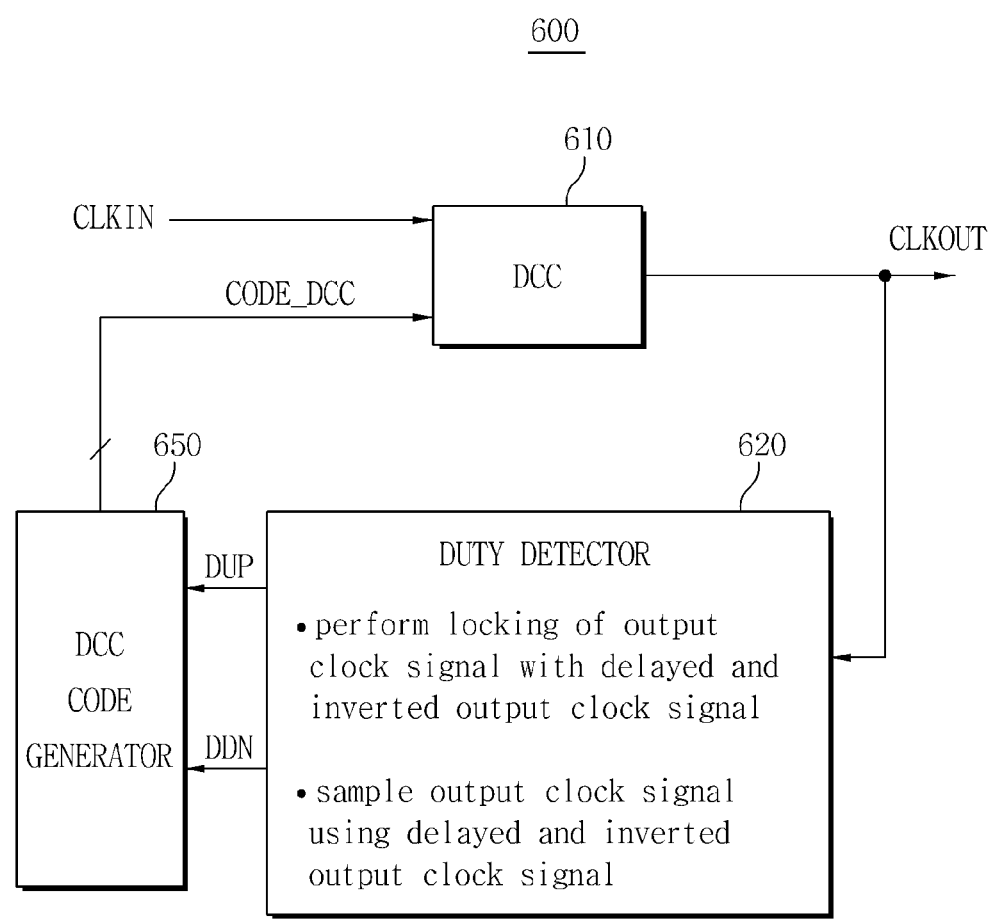
FIG. 29 is a block diagram of yet another duty correcting circuit according to example embodiments of inventive concepts.

FIG. 29 is a block diagram of yet another duty correcting circuit 600 according to example embodiments of the inventive concepts.

Referring to FIG. 29, the duty correcting circuit 600 may include a duty cycle corrector 610, a duty detector 620 and a duty correction code generator 650.

The duty cycle corrector 610 may correct a duty cycle of an input clock signal CLKIN in response to a duty correction code CODE_DCC to generate an output clock signal CLKOUT. The duty detector 620 may delay the output clock signal CLKOUT to generate a delayed output clock signal. The duty detector 620 may also invert a phase of the delayed output clock signal to generate an inverted and delayed output clock signal. The duty detector 620 may also synchronize the output clock signal to the inverted and delayed output clock signal. The duty detector 620 may also sample the output clock signal in response to the inverted and delayed output clock signal to generate sample data. The duty detector 620 may also detects a duty of the output clock signal based on logic states of the sample data to generate the duty-up signal DUP and the duty-down signal DDN. The duty correction code generator 650 may generate the duty correction code CODE_DCC in response to the duty-up signal DUP and the duty-down signal DDN.

The duty correcting circuit 600 of FIG. 29 may generate the duty correction code CODE_DCC in response to the duty-up signal DUP and the duty-down signal DDN, somewhat differently from the duty correcting circuit 500 of FIG. 15. The duty cycle corrector 610 may correct a duty cycle of an input clock signal CLKIN in response to a duty correction code CODE_DCC to generate the output clock signal CLKOUT.

Figure 30:
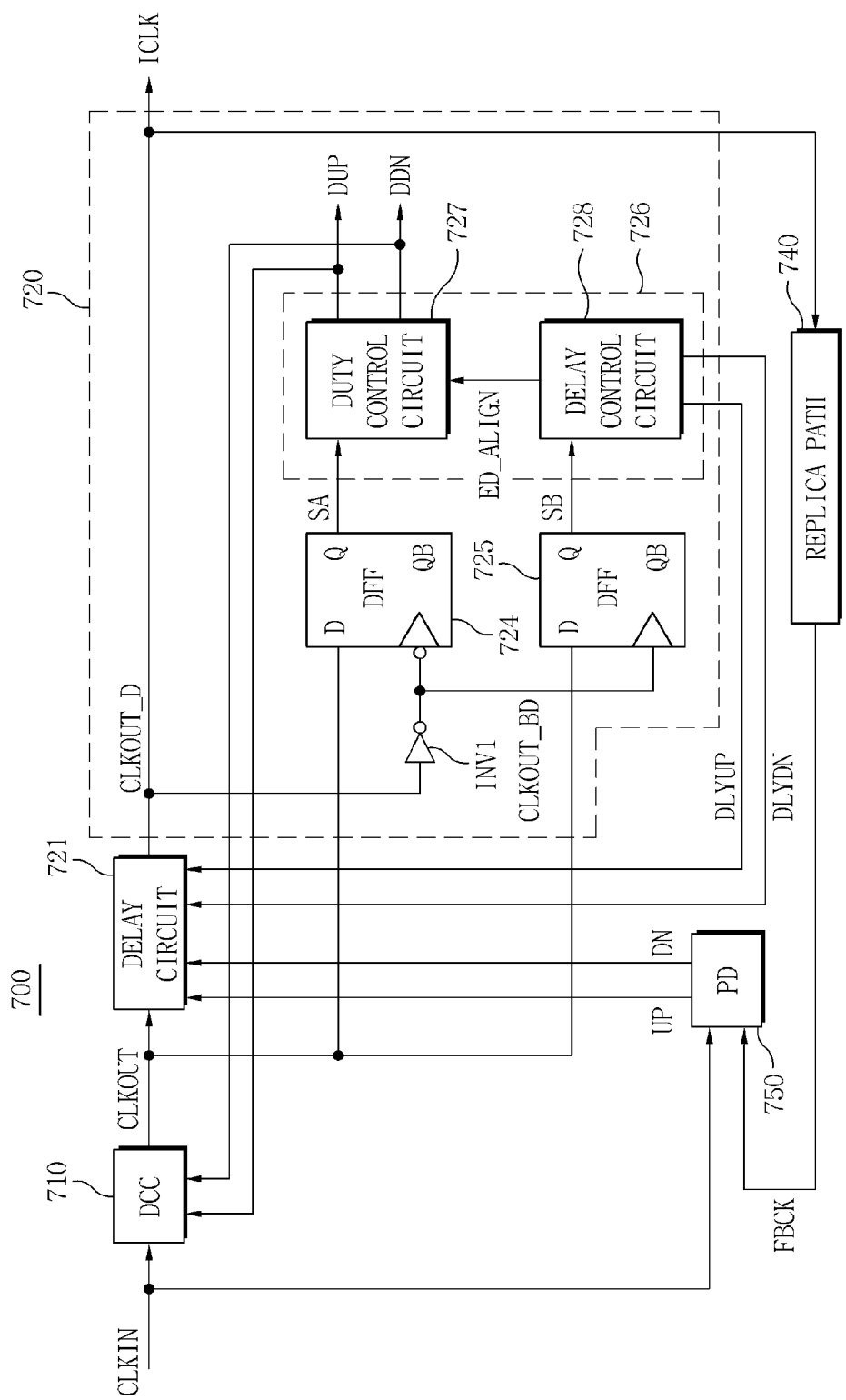
FIG. 30 is a block diagram of an example of a DLL circuit including a duty correcting circuit shown in FIG. 15 or FIG. 29 according to example embodiments of inventive concepts.

FIG. 30 is a block diagram of an example of a DLL circuit 700 including a duty correcting circuit shown in FIG. 15 or FIG. 29 according to example embodiments of inventive concepts.

Referring to FIG. 30, the DLL circuit 700 may include a duty cycle corrector 710, a delay circuit 721, a duty detector 720, a replica path 740 and a phase detector 750. The delay circuit 721 may include a delay line.

The duty cycle corrector 710 may correct a duty cycle of an input clock signal CLKIN in response to a duty-up signal DUP and a duty-down signal DDN to generate an output clock signal CLKOUT. The delay circuit 721 may delay the output clock signal CLKOUT to generate a delayed output clock signal CLKOUT_D. The duty detector 720 may invert a phase of the delayed output clock signal CLKOUT_D to generate an inverted and delayed output clock signal CLKOUT_BD. The duty detector 720 may also synchronize the output clock signal CLKOUT to the inverted and delayed output clock signal CLKOUT_BD. The duty detector 720 may also sample the output clock signal CLKOUT in response to the inverted and delayed output clock signal CLKOUT_BD to generate first sample data SA and second sample data SB. The duty detector 720 may also detects a duty of the output clock signal based on logic states of the first sample data SA and the second sample data SB to generate the duty-up signal DUP and the duty-down signal DDN. The replica path 740 may delay the delayed output clock signal CLKOUT_D to generate a feedback signal FBCK when a duty correction is completed. The phase detector 750 may detect a phase difference between the input clock signal CLKIN and the feedback signal FBCK to generate the up signal UP and the down signal DN, and provides the up signal UP and the down signal DN to the delay circuit 721.

The delay circuit 721 included in the DLL circuit 700 of FIG. 30 may have a circuit structure of the delay circuit 521 shown in FIG. 27. Therefore, the delay circuit 721 may include the delay unit including delays D1 to D5 and the interpolator 522.

The duty detector 720 may include an inverter INV1, a first flip-flop 724, a second flip-flop 725 and a control circuit 726. The inverter INV1 may invert the delayed output clock signal CLKOUT_D to generate the inverted and delayed output clock signal CLKOUT_BD. The first flip-flop 724 may sample the output clock signal CLKOUT in response to a falling edge of the inverted and delayed output clock signal CLKOUT_BD to generate first sample data SA. The second flip-flop 725 may sample the output clock signal CLKOUT in response to a rising edge of the inverted and delayed output clock signal CLKOUT_BD to generate second sample data SB. The control circuit 726 may generate the delay-up signal DLYUP, the delay-down signal DLYDN, the duty-up signal DUP and the duty-down signal DDN based on logic states of the first sample data SA and the second sample data SB.

The control circuit 726 may include a delay control circuit 728 and a duty control circuit 727. The delay control circuit may 728 generate the delay-up signal DLYUP, the delay-down signal DLYDN and an output enable signal ED_ALIGN based on a logic state of the second sample data SB. The duty control circuit 727 may generate the duty-up signal DUP and the duty-down signal DDN based on logic states of the output enable signal ED_ALIGN and the first sample data SA.

In a duty correction mode, the delay circuit 721 may adjust a delay time of the output clock signal CLKOUT based on the delay-up signal DLYUP and the delay-down signal DLYDN, output signals of the duty detector 720, and the duty cycle corrector 710 may correct a duty cycle of the input clock signal CLKIN in response to the duty-up signal DUP and the duty-down signal DDN to generate an output clock signal CLKOUT. In a normal mode the duty correction is completed, the delay circuit 721 may adjust a delay time of the output clock signal CLKOUT based on the up signal UP and the down signal DN, output signals of the phase detector 750. The DLL circuit 700 may detect a phase difference between the input clock signal CLKIN and the feedback signal FBCK to generate the internal clock signal ICLK that is synchronized with the input clock signal CLKIN.

Figure 31:
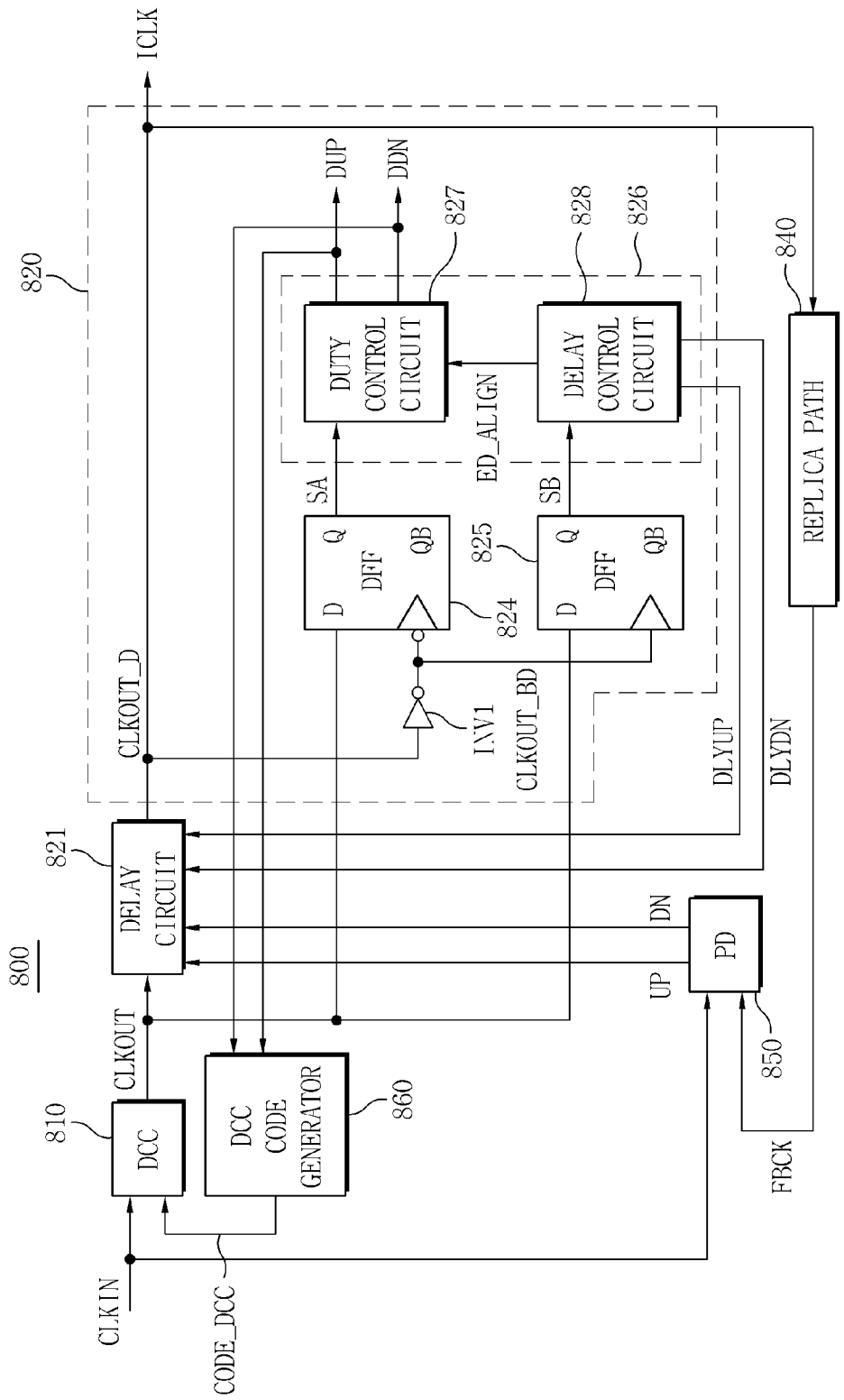
FIG. 31 is a block diagram of another example of a DLL circuit including a duty correcting circuit shown in FIG. 15 or FIG. 29 according to example embodiments of inventive concepts.

FIG. 31 is a block diagram of another example of a DLL circuit 800 including a duty correcting circuit shown in FIG. 15 or FIG. 29 according to example embodiments of inventive concepts.

Referring to FIG. 31, the DLL circuit 800 may include a duty cycle corrector 810, a delay circuit 821, a duty detector 820, a replica path 840, a phase detector 850 and a duty correction code generator 860.

The DLL circuit 800 of FIG. 31 may be a circuit in which the duty correction code generator 860 that generates a duty correction code CODE_DCC based on the duty-up signal DUP and the duty-down signal DDN is added to the DLL circuit 700 of FIG. 30. The duty cycle corrector 810 may correct a duty cycle of the input clock signal CLKIN in response to the duty correction code CODE_DCC to generate an output clock signal CLKOUT.

The duty detector 820 may invert a phase of the delayed output clock signal CLKOUT_D to generate an inverted and delayed output clock signal CLKOUT_BD. The duty detector 820 may also synchronize the output clock signal CLKOUT to the inverted and delayed output clock signal CLKOUT_BD. The duty detector 820 may also sample the output clock signal CLKOUT in response to the inverted and delayed output clock signal CLKOUT_BD to generate first sample data SA and second sample data SB. The duty detector 820 may also detects a duty of the output clock signal based on logic states of the first sample data SA and the second sample data SB to generate the duty-up signal DUP and the duty-down signal DDN.

The delay circuit 821 may include a delay line. The delay circuit 821 may delay the output clock signal CLKOUT to generate a delayed output clock signal CLKOUT_D. The replica path 840 may delay the delayed output clock signal CLKOUT_D to generate a feedback signal FBCK when a duty correction is completed.

The DLL circuit 800 may detect a phase difference between the input clock signal CLKIN and the feedback signal FBCK to generate the internal clock signal ICLK that is synchronized with the input clock signal CLKIN.

Figure 32:
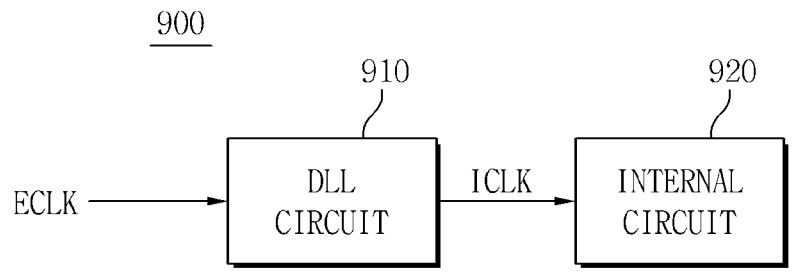
FIG. 32 is a block diagram of an example of a semiconductor device including the DLL circuit according to example embodiments of inventive concepts.

FIG. 32 is a block diagram of an example of a semiconductor device 900 including the DLL circuit according to example embodiment of inventive concepts.

Referring to FIG. 32, the semiconductor device 900 may include a DLL circuit 910 and an internal circuit 920.

The DLL circuit 910 may include a duty correcting circuit (e.g. duty correcting circuit 100), and may generate an internal clock signal ICLK synchronized with the external clock signal ECLK and whose duty cycle is corrected. The internal circuit 920 may operate in response to the internal clock signal ICLK. The DLL circuit 910 may have a circuit structure shown in FIG. 30 or FIG. 31.

Therefore, the duty correcting circuit including the duty detector according to example embodiments of inventive concepts may adjust a delay time of a sampling clock signal in a digital mode based on logic states of sampled data to detect a duty of an output clock signal. Further, the duty correcting circuit may synchronize the output clock signal CLKOUT with the input clock signal CLKIN and correct the duty using the inverted and delayed clock signal CLKOUT_BD. Therefore, the duty correcting circuit according to example embodiments of inventive concepts may detect a duty of the output clock signal and generate an output clock signal having a duty ratio of 50:50, e.g., 50%.

Figure 33:
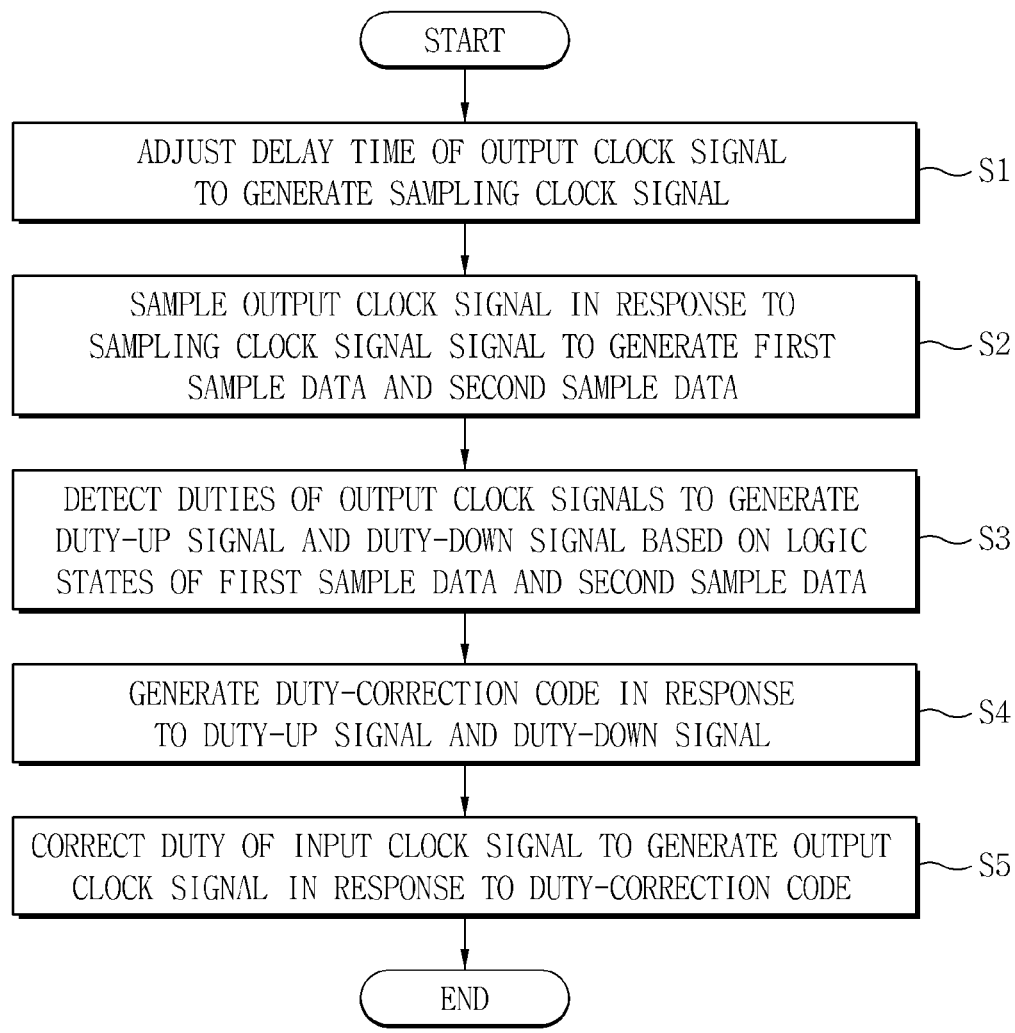
FIG. 33 is a flowchart illustrating a method of correcting a duty according to example embodiments of inventive concepts.

FIG. 33 is a flowchart illustrating a method of correcting a duty according to embodiments of the inventive concept.

Referring to FIG. 33, the method of correcting a duty according to example embodiments of inventive concepts may include the following steps:

adjusting a delay time of an output clock signal to generate a sampling clock signal (S1);

sampling the output clock signal in response to the sampling clock signal to generate first sample data and second sample data (S2);

detecting a duty of the output clock signal based on logic states of the first sample data and the second sample data to generate a duty-up signal and a duty-down signal (S3);

generating a duty correction code in response to the duty-up signal and the duty-down signal (S4); and correcting a duty cycle of an input clock signal in response to the duty correction code to generate the output clock signal (S5).

Figure 34:
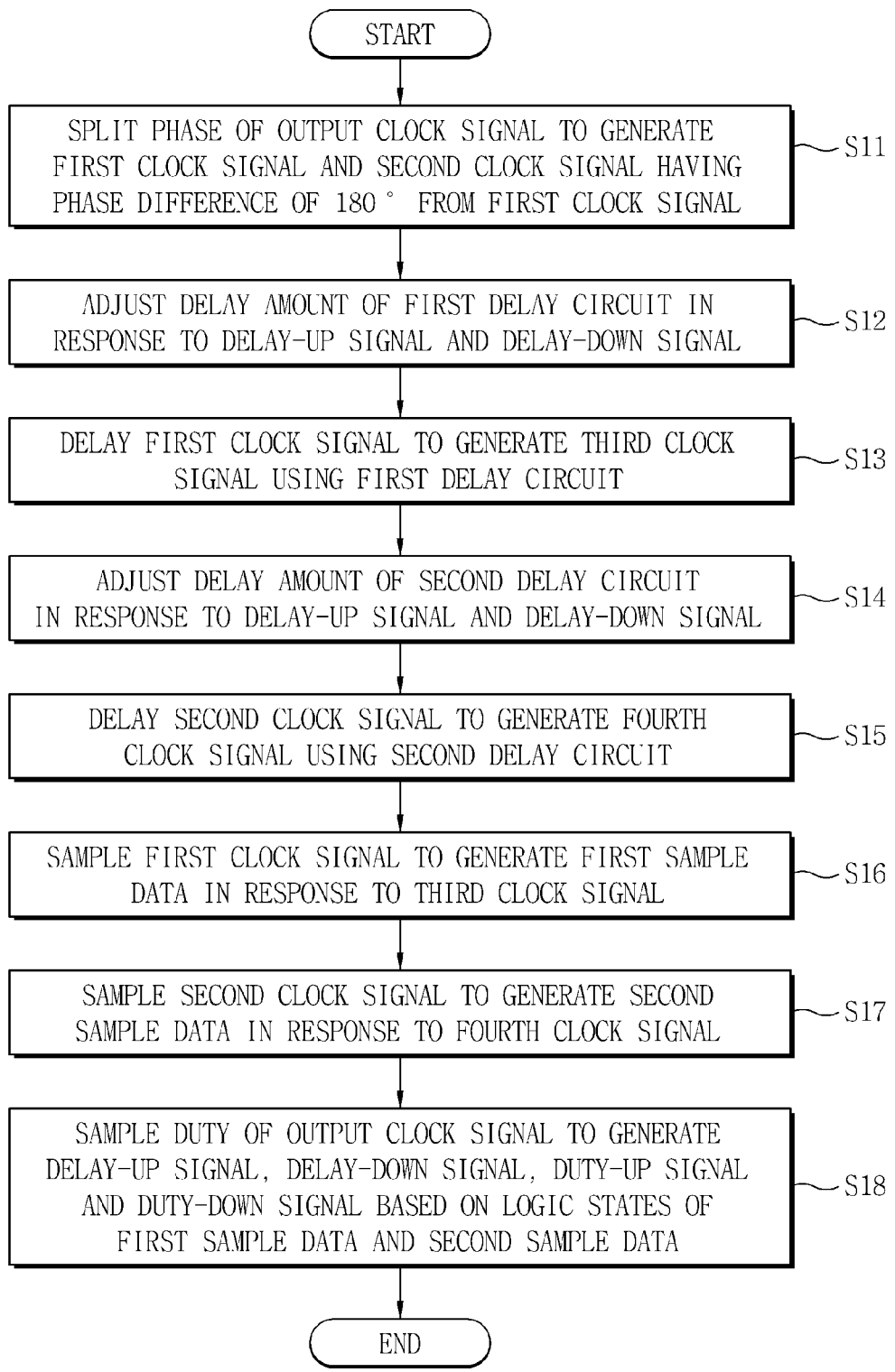
FIG. 34 is a flowchart illustrating another method of correcting a duty according to example embodiments of inventive concepts.

FIG. 34 is a flowchart illustrating another method of correcting a duty according to example embodiments of inventive concepts.

Referring to FIG. 34, the method of correcting a duty according to example embodiments of the inventive concepts may include the following steps:

splitting a phase of the output clock signal to generate a first clock signal and a second clock signal having a phase difference of 180° from the first clock signal (S11);

adjusting a delay amount in response to a delay-up signal and a delay-down signal (S12).

delaying the first clock signal to generate a third clock signal using the first delay circuit (S13);

adjusting a delay amount in response to the delay-up signal and the delay-down signal (S14);

delaying the second clock signal to generate a fourth clock signal using the second delay circuit (S15);

sampling the first clock signal in response to the third clock signal to generate the first sample data (S16);

sampling the second clock signal in response to the fourth clock signal to generate the second sample data (S17); and detecting the duty of the output clock signal based on logic states of the first sample data and the second sample data to generate the delay-up signal, the delay-down signal, the duty-up signal and the duty-down signal (S18).

Figure 35:
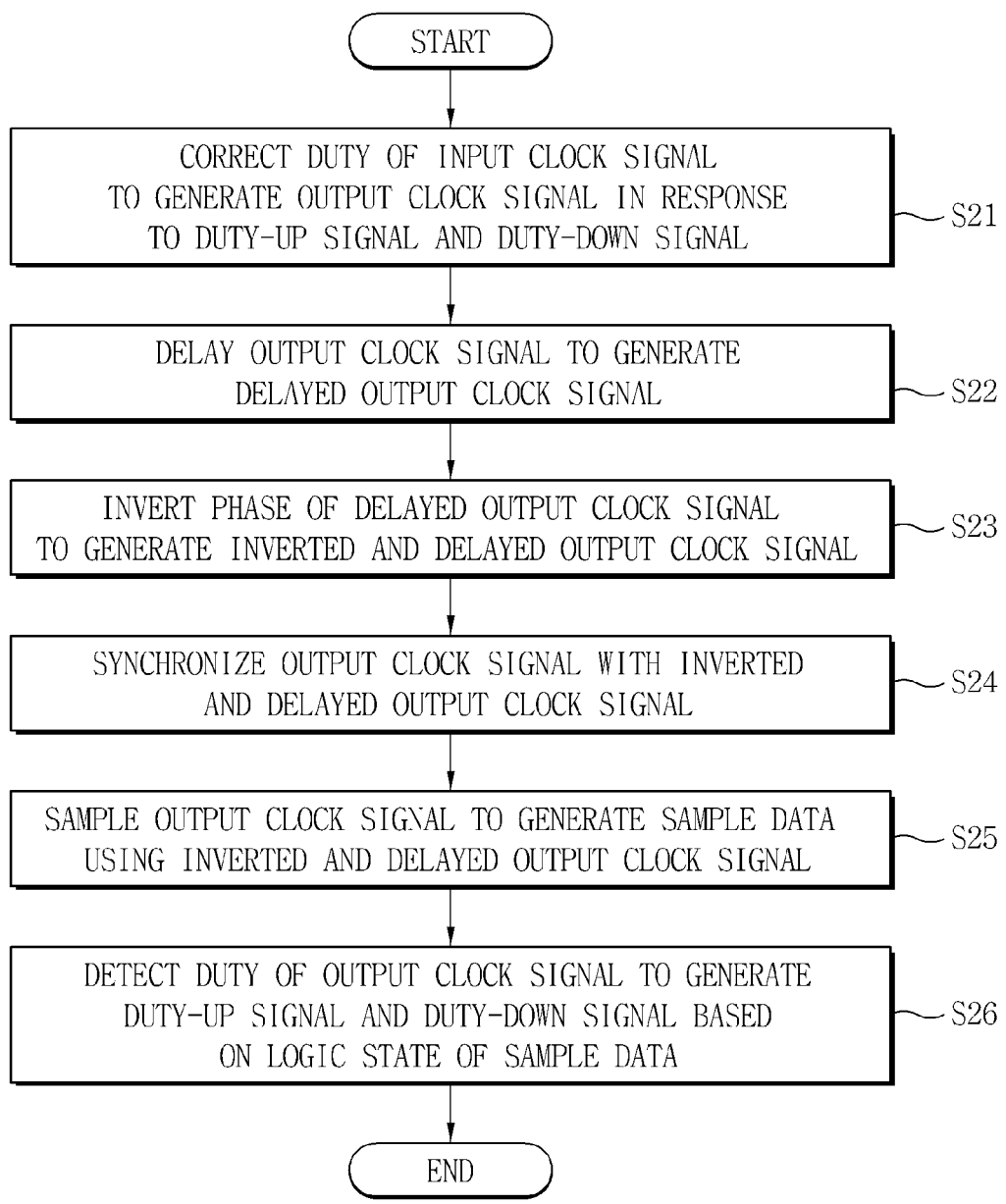
FIG. 35 is a flowchart illustrating still another method of correcting a duty according to example embodiments of inventive concepts.

FIG. 35 is a flowchart illustrating still another method of correcting a duty according to example embodiments of inventive concepts.

Referring to FIG. 35, the method of correcting a duty according to example embodiments of inventive concepts may include the following steps:

correcting a duty cycle of an input clock signal in response to a duty-up signal and a duty-down signal to generate an output clock signal (S21);

delaying the output clock signal to generate a delayed output clock signal (S22);

inverting a phase of the delayed output clock signal to generate an inverted and delayed output clock signal (S23);

synchronizing the output clock signal to the inverted and delayed output clock signal (S24);

sampling the output clock signal in response to the inverted and delayed output clock signal to generate sample data (S25); and detecting a duty of the output clock signal based on logic states of the sample data to generate the duty-up signal and the duty-down signal (S26).

Figure 36:
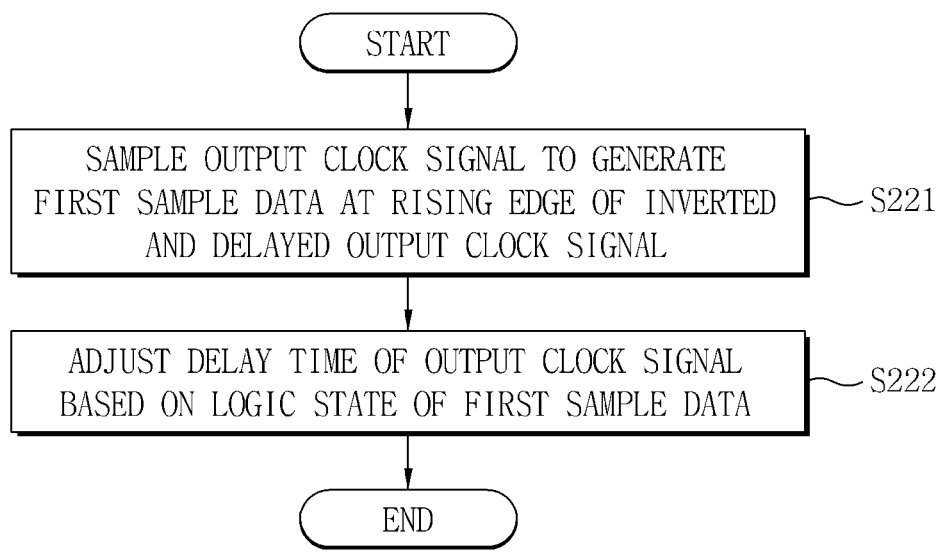
FIG. 36 is a flowchart illustrating a method of generating a delayed output clock signal included in the method of correcting a duty shown in FIG. 35, according to example embodiments of inventive concepts.

FIG. 36 is a flowchart illustrating a method of generating a delayed output clock signal included in the method of correcting a duty shown in FIG. 35, according to example embodiments of inventive concepts.

Referring to FIG. 36, the method of generating the delayed output clock signal according to example embodiments of inventive concepts may include the following steps:

sampling the output clock signal at a rising edge of the inverted and delayed output clock signal to generate first sample data (S221); and adjusting a delay time of the output clock signal based on a logic state of the first sample data (S222).

Figure 37:
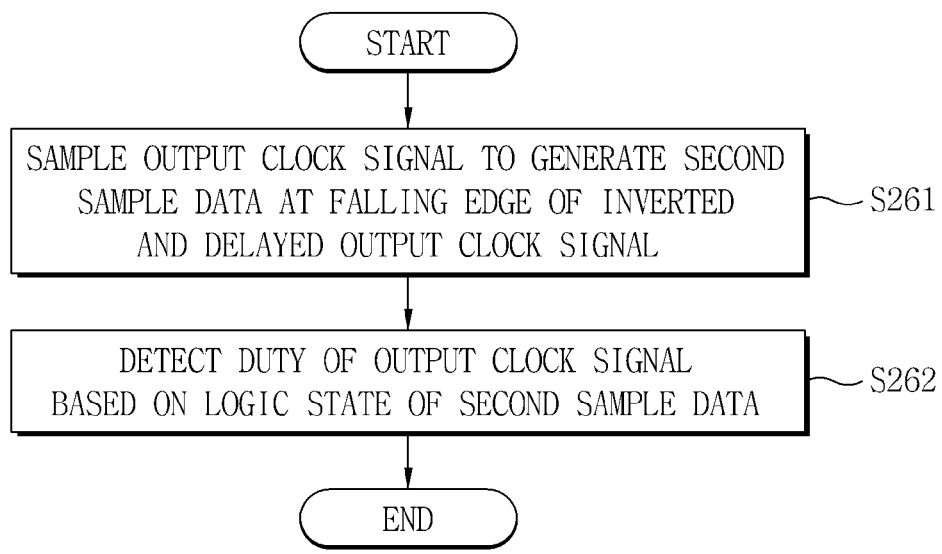
FIG. 37 is a flowchart illustrating a method of detecting a duty of an output clock signal included in the method of correcting a duty shown in FIG. 35, according to example embodiments of inventive concepts.

FIG. 37 is a flowchart illustrating a method of detecting a duty of an output clock signal included in the method of correcting a duty shown in FIG. 35, according to example embodiments of inventive concepts.

Referring to FIG. 37, the method of detecting a duty of an output clock signal according to example embodiments of inventive concepts may include the following steps:

sampling the output clock signal at a falling edge of the inverted and delayed output clock signal to generate second sample data (S261); and detecting a duty of the output clock signal based on a logic state of the second sample data (S262).

In the method of correcting a duty according to example embodiments of inventive concepts, duty correction may be performed according to the flow charts illustrated in FIGS. 35 to 37. The output clock signal CLKOUT may have a logic low state and logic high state alternately at a detecting time point DP when synchronization between the output clock signal CLKOUT and the inverted and delayed output clock signal CLKOUT_BD is completed and the duty ratio is about 50:50. In this condition, the duty correction may be complete. Further, if a duty correction time is predetermined, for example 200 cycles, the duty correction may be completed if the duty correction is repeatedly performed and the duty correction time has passed.

Although a duty correcting circuit that is mainly used in a DLL circuit is described above, a duty correcting circuit according to example embodiments of inventive concepts may also be applied to a phase-locked loop (PLL) circuit.

Example embodiments of inventive concepts may be applied to a semiconductor device, particularly, to a clock generating circuit of a semiconductor device.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

While example embodiments have been particularly shown and described, it will be understood by one of ordinary skill in the art that variations in form and detail may be made therein without departing from the spirit and scope of the claims.

What is claimed is:

1. A duty correcting circuit comprising:
   a duty cycle corrector configured to correct a duty cycle of an input clock signal in response to a duty correction code to generate an output clock signal;
   a duty detector configured to,
   adjust a delay time of the output clock signal to generate a sampling clock signal,
   sample the output clock signal in response to the sampling clock signal,
   generate first sample data and second sample data, and
   detect a duty of the output clock signal based on logic states of the first sample data and the second sample data to generate a duty-up signal and a duty-down signal; and
   a duty correction code generator configured to generate the duty correction code in response to the duty-up signal and the duty-down signal,
   wherein the duty detector is configured to adjust the delay time of the output clock signal based on the logic states of the first and second sample data.

2. The circuit of claim 1, wherein the duty detector comprises:
   a phase splitter configured to split a phase of the output clock signal to generate a first clock signal and a second clock signal, the second clock signal having a phase difference of 180 degrees from the first clock signal;
   a first delay circuit configured to,
     adjust a delay amount in response to a delay-up signal and a delay-down signal, and
     delay the first clock signal to generate a third clock signal;
   a second delay circuit configured to,
     adjust a delay amount in response to the delay-up signal and the delay-down signal, and
     delay the second clock signal to generate a fourth clock signal;
   a first flip-flop configured to sample the first clock signal in response to the third clock signal to generate the first sample data;
   a second flip-flop configured to sample the second clock signal in response to the fourth clock signal to generate the second sample data; and
   a control circuit configured to detect the duty of the output clock signal based on logic states of the first sample data and the second sample data to generate the delay-up signal, the delay-down signal, the duty-up signal and the duty-down signal.

3. The circuit of claim 2, wherein the duty detector is configured to,
generate the delay-up signal to increase the delay time of the output clock signal if the first sample data and the second sample data are enabled, and
generate the delay-down signal to decrease the delay time of the output clock signal if the first sample data and the second sample data are disabled.

4. The circuit of claim 2, wherein the duty detector is configured to generate the duty-up signal to increase the duty of the output clock signal if the first sample data is disabled and the second sample data is enabled.

5. The circuit of claim 2, wherein the duty detector is configured to generate the duty-down signal to decrease the duty of the output clock signal if the first sample data is enabled and the second sample data is disabled.

6. The circuit of claim 1, wherein the duty detector comprises:
a phase splitter configured to split a phase of the output clock signal to generate a first clock signal and a second clock signal, the first clock signal and the second clock signal having different phases;
a delay circuit configured to,
adjust a delay amount in response to a delay-up signal and a delay-down signal, and
delay the first clock signal to generate a third clock signal based on the delay amount;
a first flip-flop configured to sample the first clock signal in response to a rising edge of the third clock signal to generate the first sample data;
a second flip-flop configured to sample the second clock signal in response to a falling edge of the third clock signal to generate the second sample data; and
a control circuit configured to detect the duty of the output clock signal based on logic states of the first sample data and the second sample data to generate the delay-up signal, the delay-down signal, the duty-up signal and the duty-down signal.

7. The circuit of claim 1, wherein the duty detector comprises:
a first phase splitter configured to split a phase of the output clock signal to generate a first clock signal and a second clock signal, the first clock signal and the second clock signal having different phases;
a delay circuit configured to,
adjust a delay amount in response to a delay-up signal and a delay-down signal, and
delay the first clock signal based on the delay amount;
a second phase splitter configured to split a phase of an output signal of the delay circuit to generate a third clock signal and a fourth clock signal, the third clock signal and the fourth clock signal having a phase difference of 180 degrees from each other;
a first flip-flop configured to sample the first clock signal in response to the third clock signal to generate the first sample data;
a second flip-flop configured to sample the second clock signal in response to the fourth clock signal to generate the second sample data; and
a control circuit configured to detect the duty of the output clock signal based on logic states of the first sample data and the second sample data to generate the delay-up signal, the delay-down signal, the duty-up signal and the duty-down signal.

8. A duty correcting circuit comprising:
a duty cycle corrector configured to correct a duty cycle of an input clock signal in response to a duty-up signal and a duty-down signal to generate an output clock signal; and
a duty detector configured to,
delay the output clock signal to generate a delayed output clock signal,
invert a phase of the delayed output clock signal to generate an inverted and delayed output clock signal,
synchronize the output clock signal to the inverted and delayed output clock signal,
sample the output clock signal in response to the inverted and delayed output clock signal to generate first sample data and second sample data, and
detect a duty of the output clock signal based on logic states of the first sample data and the second sample data to generate the duty-up signal and the duty-down signal.

9. The circuit of claim 8, wherein
the duty detector is configured to adjust a delay time of the output clock signal based on a logic state of the first sample data which is the output clock signal sampled at a rising edge of the inverted and delayed output clock signal, and
the duty detector is configured to detect a duty of the output clock signal based on a logic state of the second sample data which is the output clock signal sampled at a falling edge of the inverted and delayed output clock signal.

10. The circuit of claim 8, wherein the duty detector is configured to adjust the delay time of the output clock signal using a delay line of a delay-locked-loop circuit.

11. The circuit of claim 8, wherein the duty detector comprises:
a delay circuit configured to delay the output clock signal in response to a delay-up signal and a delay-down signal to generate the delayed output clock signal;
an inverter configured to invert the delayed output clock signal to generate the inverted and delayed output clock signal;
a first flip-flop configured to sample the output clock signal in response to a falling edge of the inverted and delayed output clock signal to generate the first sample data;
a second flip-flop configured to sample the output clock signal in response to a rising edge of the inverted and delayed output clock signal to generate the second sample data; and
a control circuit configured to generate the delay-up signal, the delay-down signal, the duty-up signal and the duty-down signal based on logic states of the first sample data and the second sample data.

12. The circuit of claim 11, wherein
the duty detector is configured to generate the delay-up signal to increase the delay time of the output clock signal if the second sample data has a first logic state, and
the duty detector is configured to generate the delay-down signal to decrease the delay time of the output clock signal if the second sample data has a second logic state.

13. The circuit of claim 11, wherein
the duty detector is configured to generate the duty-up signal to increase the duty of the output clock signal if an output enable signal is enabled and the first sample data has a first logic state, and
the duty detector is configured to generate the duty-down signal to decrease the duty of the output clock signal if the output enable signal is enabled and the first sample data has a second logic state.

14. The circuit of claim 11, wherein the duty correcting circuit further comprises a duty correction code generator configured to generate a duty correction code in response to the duty-up signal and the duty-down signal and provide the duty correction code to the duty cycle corrector.

15. A duty correcting circuit comprising:
   a duty cycle corrector configured to generate an output clock signal based on a duty correction code;
   a duty detector configured to,
      detect a duty of the output clock signal based on logic states associated with sampled data,
      generate a duty-up signal and a duty-down signal based on the detected duty; and
   a duty correction code generator configured to generate the duty correction code based on the duty-up signal and the duty-down signal,
   wherein the duty detector includes,
      a delay circuit configured to,
         adjust a delay amount based on a delay-up signal and a delay-down signal, and
         generate another clock signal based on the delay amount and a phase of the output clock signal.

16. The circuit of claim 15, wherein the duty detector comprises:
   a phase splitter configured to generate a first clock signal and a second clock signal based on a phase of the output clock signal, the second clock signal having a phase difference of 180 degrees from the first clock signal.

17. The circuit of claim 15, wherein the duty detector comprises:
   one or more flip-flops configured to generate the sampled data based on the another clock signal.

18. The circuit of claim 17, wherein the duty detector comprises:
   a control circuit configured to generate the delay-up signal, the delay-down signal, the duty-up signal and the duty-down signal based on the output clock and the logic states associated with the sampled data.

* * * * *